United States Patent
Yang et al.

(10) Patent No.: US 10,782,611 B2
(45) Date of Patent: Sep. 22, 2020

(54) QUANTUM DOTS, A COMPOSITION OR COMPOSITE INCLUDING THE SAME, AND EN ELECTRONIC DEVICE INCLUDING THE SAME

(71) Applicant: SAMSUNG ELECTRONICS CO., LTD., Suwon-si, Gyeonggi-do (KR)

(72) Inventors: Hyeyeon Yang, Suwon-si (KR); Eun Joo Jang, Suwon-si (KR); Hyo Sook Jang, Suwon-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 226 days.

(21) Appl. No.: 15/900,519

(22) Filed: Feb. 20, 2018

(65) Prior Publication Data
US 2018/0239245 A1  Aug. 23, 2018

(30) Foreign Application Priority Data
Feb. 20, 2017 (KR) .................. 10-2017-0022577

(51) Int. Cl.
*G03F 7/028* (2006.01)
*G02B 5/20* (2006.01)
(Continued)

(52) U.S. Cl.
CPC .......... *G03F 7/0044* (2013.01); *C08F 220/06* (2013.01); *C09D 4/00* (2013.01);
(Continued)

(58) Field of Classification Search
CPC ........ G03F 7/0007; G03F 7/027; G03F 7/028; G03F 7/032; G03F 7/033; G03F 7/2002;
(Continued)

(56) References Cited

U.S. PATENT DOCUMENTS 8,552,415 B2  10/2013  Toda
8,947,619 B2  2/2015  Li et al.
(Continued)

FOREIGN PATENT DOCUMENTS

| JP | 2009514178 A | 4/2009 |
|---|---|---|
| KR | 1020060024545 A | 3/2006 |
| KR | 1020150075039 A | 7/2015 |

OTHER PUBLICATIONS

Jan Suchanek, et al., "Photophysical properties of CdSe quantum dot self-assemblied with zin phthalocyanines and azaphthalocyanines", Photochem. Photobiol. Sci. 2013, 12, 743-750.
(Continued)

*Primary Examiner* — John A McPherson
(74) *Attorney, Agent, or Firm* — Cantor Colburn LLP

(57) ABSTRACT

A photosensitive composition, a quantum dot polymer composite pattern prepared therefrom, and a layered structure and an electronic device including the same. The photosensitive composition includes plurality of quantum dots; a luminescent material other than a quantum dot; a carboxylic acid group containing binder; a photopolymerizable monomer having a carbon-carbon double bond; and a photoinitiator, and the luminescent material comprises a fluorophore, a nanosized inorganic phosphor, or a combination thereof.

23 Claims, 7 Drawing Sheets

(51) Int. Cl.
*G03F 7/004* (2006.01)
*C09K 11/70* (2006.01)
*C09K 11/77* (2006.01)
*C08F 220/06* (2006.01)
*G03F 7/00* (2006.01)
*G03F 7/16* (2006.01)
*G03F 7/20* (2006.01)
*G03F 7/32* (2006.01)
*G03F 7/40* (2006.01)
*G03F 7/031* (2006.01)
*G02F 1/13357* (2006.01)
*C09K 11/02* (2006.01)
*C09D 4/00* (2006.01)
C08K 3/30 (2006.01)
C08K 3/32 (2006.01)
C08K 9/10 (2006.01)
B82Y 40/00 (2011.01)
B82Y 20/00 (2011.01)

(52) U.S. Cl.
CPC ............ *C09K 11/02* (2013.01); *C09K 11/703* (2013.01); *C09K 11/7731* (2013.01); *G02F 1/133617* (2013.01); *G03F 7/0007* (2013.01); *G03F 7/0043* (2013.01); *G03F 7/0047* (2013.01); *G03F 7/031* (2013.01); *G03F 7/162* (2013.01); *G03F 7/168* (2013.01); *G03F 7/2002* (2013.01); *G03F 7/322* (2013.01); *G03F 7/40* (2013.01); *B82Y 20/00* (2013.01); *B82Y 40/00* (2013.01); *C08F 2800/10* (2013.01); *C08K 3/30* (2013.01); *C08K 3/32* (2013.01); *C08K 9/10* (2013.01); *C08K 2003/3018* (2013.01); *C08K 2003/3036* (2013.01); *C08K 2201/001* (2013.01); *C08K 2201/011* (2013.01); *G02F 2202/36* (2013.01); *Y10S 977/774* (2013.01); *Y10S 977/818* (2013.01); *Y10S 977/824* (2013.01); *Y10S 977/892* (2013.01); *Y10S 977/896* (2013.01); *Y10S 977/95* (2013.01)

(58) Field of Classification Search
CPC ..... B82Y 20/00; B82Y 40/00; Y10S 977/774; Y10S 977/952; C08F 220/06; C09K 11/02; C09K 11/06; C09K 11/08
USPC .................................. 430/7, 281.1; 349/106
See application file for complete search history.

(56) References Cited

U.S. PATENT DOCUMENTS

| | | | |
|---|---|---|---|
| 2007/0007881 A1* | 1/2007 | Kim | B82Y 10/00 313/501 |
| 2007/0159061 A1 | 7/2007 | Krummacher et al. | |
| 2008/0012031 A1* | 1/2008 | Jang | C09K 11/02 257/89 |
| 2016/0215212 A1* | 7/2016 | Lee | G03F 7/0007 |
| 2018/0284613 A1* | 10/2018 | Hirayama | G03F 7/16 |

OTHER PUBLICATIONS

M.S. Smirnov, et al., "Luminescence properties of hybrid associates of colloidal CdS quantum dots with j-aggregates of thiatrimethine cyanine dye", Journal of Luminescence 176 (2016) 77-85.
S.K. Gorbatsevich, et al., "Fluorescence of CdSe/ZnS quantum dots in solid solutions in the presence of organic molecules DODCI", Journal of Luminescence 110 (2004) 23-29.

* cited by examiner

QUANTUM DOTS, A COMPOSITION OR COMPOSITE INCLUDING THE SAME, AND EN ELECTRONIC DEVICE INCLUDING THE SAME

CROSS-REFERENCE TO RELATED APPLICATION

This application claims priority to Korean Patent Application No. 10-2017-0022577, filed in the Korean Intellectual Property Office on Feb. 20, 2017, and all the benefits accruing therefrom under 35 U.S.C. § 119, the content of which is incorporated herein in its entirety by reference.

BACKGROUND

1. Field

A photosensitive composition, a quantum dot-polymer composite prepared therefrom, and a layered structure and an electronic device including the same are disclosed.

2. Description of the Related Art

Quantum dots (e.g., semiconductor nanocrystal particles) may be used for various display devices (e.g., liquid crystal displays (LCDs)) in the form of a quantum dot (QD)-polymer composite. In order to be used in various devices, there remains a need to develop a technology for preparing a quantum dot-polymer composite capable of showing, e.g., exhibiting, enhanced properties.

SUMMARY

An embodiment is related to a photosensitive composition from which a pattern of a quantum dot-polymer composite or a patternable quantum dot-polymer composite may be prepared.

An embodiment is related to a production method of the aforementioned photosensitive composition.

An embodiment is related to a quantum dot-polymer composite prepared from the aforementioned photosensitive composition.

An embodiment provides a layered structure including the quantum dot-polymer composite.

An embodiment provides an electronic device including the quantum dot-polymer composite.

In an embodiment, a photosensitive composition includes:
a quantum dot (e.g., a plurality of quantum dots);
a luminescent material except for a quantum dot (e.g., a semiconductor nanocrystal particle);
a carboxylic acid group-containing binder;
a photopolymerizable monomer including a carbon-carbon double bond; and
a photoinitiator, wherein the luminescent material includes a fluorophore, a (e.g., nanosized) inorganic phosphor, or a combination thereof.

The quantum dot absorbs at least a portion of light emitted from the luminescent material.

The quantum dot may include a Group II-VI compound, a Group III-V compound, a Group IV-VI compound, a Group IV element or compound, a Group I-III-VI compound, a Group I-II-IV-VI compound, or a combination thereof.

A maximum photoluminescent peak wavelength of the quantum dot may be present in a range of about 500 nanometers (nm) to about 650 nm.

A maximum photoluminescent peak wavelength of the quantum dot may be present in a range of about 500 nm to about 540 nm.

A maximum photoluminescent peak wavelength of the quantum dot may be present in a range of about 610 nm to about 640 nm.

A maximum absorption peak wavelength of the luminescent material may be present in a range of about 400 nm to about 510 nm.

A normalized photoluminescent spectrum of the luminescent material and a normalized ultraviolet-visible (UV-Vis) absorption spectrum of the quantum dot are overlapped and a percentage of an overlapped area with respect to a total area of the normalized photoluminescent spectrum of the luminescent material may be greater than or equal to about 10%.

The percentage of an overlapped area with respect to a total area of the normalized photoluminescent spectrum of the luminescent material may be greater than or equal to about 30%.

The percentage of an overlapped area with respect to a total area of the normalized photoluminescent spectrum of the luminescent material may be greater than or equal to about 40%.

A difference between a first excitonic absorption peak wavelength of the quantum dot and a maximum photoluminescent peak wavelength of the luminescent material may be less than or equal to about 160 nm.

A maximum photoluminescent peak wavelength of the quantum dot may be present in a range of about 500 nm to about 540 nm and the difference between a first excitonic absorption peak wavelength of the quantum dot and a maximum photoluminescent peak wavelength of the luminescent material may be less than or equal to about 60 nm.

A maximum photoluminescent peak wavelength of the quantum dot may be present in a range of about 610 nm to about 640 nm and the difference between a first excitonic absorption peak wavelength of the quantum dot and a maximum photoluminescent peak wavelength of the luminescent material may be from about 110 nm to about 160 nm.

The luminescent material may include an anthracene compound, a naphthalene compound, a triazole compound, a phenoxazine compound, an acridine compound, a perylene compound, a coumarin compound, a porphyrin compound, a pyran compound, a pyrene compound, a fluorene compound, a fluorescein compound, a boron-dipyrromethene (BODIPY) compound, a polymer compound including a backbone including a thiophene moiety and a fluorene moiety, a green light emitting inorganic phosphor, or a combination thereof. A maximum photoluminescent peak wavelength of the green light emitting inorganic phosphor may be greater than or equal to about 510 nm and less than or equal to about 560 nm.

A weight ratio of the luminescent material with respect to the quantum dot may be greater than or equal to about $10^{-4}:1$ and less than or equal to about 0.1:1.

The carboxylic acid group-containing binder may have an acid value of greater than or equal to about 50 milligrams of KOH per gram and less than or equal to about 250 milligrams of KOH per gram. The carboxylic acid group-containing polymer may have an acid value of about 100 mg KOH/gram to 200 mg KOH/gram.

The carboxylic acid group-containing binder includes a copolymer of a monomer combination including a first monomer including a carboxylic acid group and a carbon-carbon double bond, a second monomer including a carbon-carbon double bond and a hydrophobic moiety and not including a carboxylic acid group, and optionally, a third monomer including a carbon-carbon double bond and a hydrophilic moiety and not including a carboxylic acid group; a multiple aromatic ring-containing polymer including a carboxylic acid group and including a backbone structure in a main chain, wherein the backbone structure includes a quaternary carbon atom, which is a part of a cyclic group, and two aromatic rings bound to the quaternary carbon atom; or a combination thereof.

The copolymer may include a first repeating unit derived from the first monomer, a second repeating unit derived from the second monomer, and optionally a third repeating unit derived from the third monomer.

The first repeating unit may include a unit represented by Chemical Formula 1-1, a unit represented by Chemical Formula 1-2, or a combination thereof:

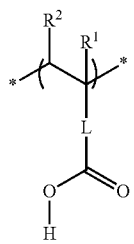

Chemical Formula 1-1 wherein
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a divalent C1 to C15 alkylene group, or a C6 to C12 arylene group, and
* indicates a portion linked to an adjacent atom;

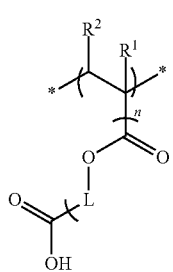

Chemical Formula 1-2 wherein
$R^1$ is hydrogen, a C1 to C3 alkyl group, or —$(CH_2)_n$—COOH (wherein n is 0 to 2),
$R^2$ is hydrogen or a C1 to C3 alkyl group,
L is a direct bond, a C1 to C15 alkylene group, a C1 to C15 alkylene group wherein at least one methylene group is replaced with —C(=O)—, —O—, —C(=O)O—, or a combination thereof, a C6 to C30 arylene group, or a divalent C3 to C30 alicyclic hydrocarbon group,
n is an integer of 1 to 3, and
* indicates a portion linked to an adjacent atom.

The second repeating unit may include a unit represented by Chemical Formula 2, a unit represented by Chemical Formula 4, a unit represented by Chemical Formula 5, a unit represented by Chemical Formula A, or a combination thereof:

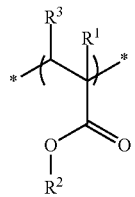

Chemical Formula 2 wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group, and
* indicates a portion linked to an adjacent atom;

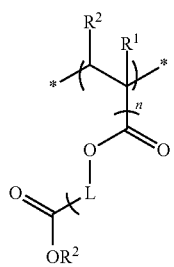

Chemical Formula 4 wherein
$R^1$ is hydrogen, or a C1 to C3 alkyl group,
L is a direct bond, a C1 to C15 alkylene group, a C1 to C15 alkylene group wherein at least one methylene group is replaced with —C(=O)—, —O—, —C(=O)O—, or a combination thereof, a C6 to C30 arylene group, or a divalent C3 to C30 alicyclic hydrocarbon group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group,
n is an integer of 1 to 3, and
* indicates a portion linked to an adjacent atom;

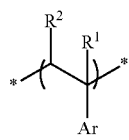

Chemical Formula 5 wherein
each of $R^1$ and $R^2$ is independently hydrogen or a C1 to C3 alkyl group, Ar is a substituted or unsubstituted C6 to C30 aryl group or a substituted or unsubstituted C3 to C30 alicyclic group, and

* indicates a portion linked to an adjacent atom;

Chemical Formula A

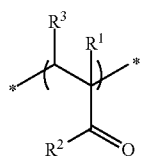

wherein $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom.

The third repeating unit may be represented by Chemical Formula 3:

Chemical Formula 3

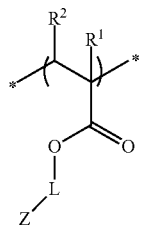

wherein each of $R^1$ and $R^2$ is independently hydrogen or a C1 to C3 alkyl group, L is a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

The backbone structure of the multiple aromatic ring-containing polymer may include a repeating unit represented by Chemical Formula B:

Chemical Formula B

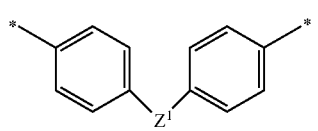

wherein

* indicates a portion that is linked to an adjacent atom of the main chain of the binder, $Z^1$ is a linking moiety represented by any one of Chemical Formulae A-1 to A-6, and in Chemical Formulae B-1 to B-6, * indicates a portion that is linked to the aromatic ring:

Chemical Formula B-1

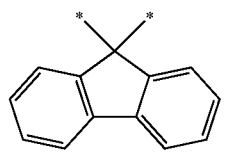

Chemical Formula B-2

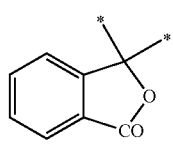

Chemical Formula B-3

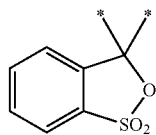

Chemical Formula B-4

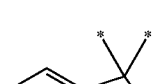

Chemical Formula B-5

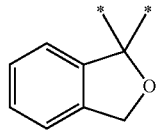

wherein $R^a$ is hydrogen, an ethyl group, $C_2H_4Cl$, $C_2H_4OH$, $CH_2CH=CH_2$, or a phenyl group, Chemical Formula B-6

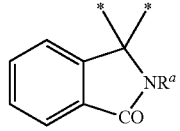

In the copolymer of the carboxylic acid group-containing binder, an amount of the first repeating unit may be greater than or equal to about 5 mole percent (mol %), and less than or equal to about 95 mol %, an amount of the second repeating unit may be greater than or equal to about 5 mole percent (mol %), and less than or equal to about 95 mol %, and an amount of the third repeating unit may be less than or equal to about 40 mol %.

The carboxylic acid group-containing binder may have a weight molecular weight of greater than or equal to about 1,000 g/mol and less than or equal to about 100,000 g/mol.

The photopolymerizable monomer may include a (meth) acrylate monomer including at least one (e.g., two, three, four, five, six, seven, eight, or more) (meth)acrylate group.

The composition may further include a multi-thiol compound including a thiol group at each terminal end of the multi-thiol compound.

The multi-thiol compound may be represented by Chemical Formula 6:

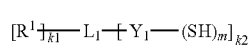

Chemical Formula 6 wherein, $R^1$ is hydrogen, a substituted or unsubstituted C1 to C40 linear or branched alkyl group, a C2 to C40 linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C2 to C30 cycloalkyl group, a substituted or unsubstituted C2 to C30 heterocycloalkyl group, a C1 to C10 alkoxy group, a hydroxy group, —NH$_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a substituted or unsubstituted C2 to C30 alkylene group or a substituted or unsubstituted C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of $Y_1$ when $Y_1$ is not a single bond, and provided that a sum of k1 and k2 does not exceed the valence of $L_1$.

The photosensitive composition may further include a metal oxide fine (and for example non-light emitting) particle.

The metal oxide fine particle may include a titanium oxide, a silicon oxide, a barium oxide, a zinc oxide, or a combination thereof.

The metal oxide fine particle may include $TiO_2$, $SiO_2$, $BaTiO_3$, $Ba_2TiO_4$, ZnO, or a combination thereof.

The metal oxide fine particle may have an average particle size of greater than or equal to about 100 nm and less than or equal to about 1,000 nm.

The photosensitive composition may further include a solvent, the photosensitive composition may include a plurality of quantum dots, and in the composition, an amount of the plurality of quantum dots may be about 1 weight percent to about 60 weight percent;

an amount of the luminescent material may be about $10^{-4}$ weight percent (wt %) to about 6 wt %;

an amount of the carboxylic acid group-containing binder may be about 0.5 weight percent to about 60 weight percent;

an amount of the photopolymerizable monomer may be about 0.5 weight percent to about 70 weight percent; and an amount of the photoinitiator may be about 0.01 weight percent to about 10 weight percent; and a balance amount may be the solvent.

In some embodiments, a quantum dot-polymer composite includes a polymer matrix; and a quantum dot (e.g., a plurality of quantum dots) and a luminescent material other than a quantum dot, dispersed in the polymer matrix, wherein the luminescent material includes a fluorophore, a (e.g., nanosized) inorganic phosphor, or a combination thereof. The quantum dot may absorb at least a portion of light emitted from the luminescent material.

The polymer matrix may include a carboxylic acid group-containing binder; a cross-linked polymerization product of a photopolymerizable monomer including a carbon-carbon double bond; or a combination thereof.

The carboxylic acid group-containing binder includes a copolymer of a monomer combination including a first monomer including a carboxylic acid group and a carbon-carbon double bond, a second monomer including a carbon-carbon double bond and a hydrophobic moiety and not including a carboxylic acid group, and, optionally, a third monomer including a carbon-carbon double bond and a hydrophilic moiety and not including a carboxylic acid group; a multiple aromatic ring-containing polymer including a carboxylic acid group and including a backbone structure in a main chain, wherein the backbone structure includes a quaternary carbon atom, which is a part of a cyclic group, and two aromatic rings bound to the quaternary carbon atom; or a combination thereof.

The quantum dot may include a Group II-VI compound, a Group III-V compound, a Group IV-VI compound, a Group IV element or compound, a Group I-III-VI compound, a Group I-II-IV-VI compound, or a combination thereof.

A maximum photoluminescent peak wavelength of the quantum dot may be present in a range of about 500 nm to about 650 nm.

A maximum photoluminescent peak wavelength of the quantum dot may be present in a range of about 500 nm to about 540 nm.

A maximum photoluminescent peak wavelength of the quantum dot may be present in a range of about 610 nm to about 640 nm.

A maximum absorption peak wavelength (Amax) of the luminescent material may be present in a range of about 400 nm to about 510 nm.

A normalized photoluminescent spectrum of the luminescent material and a normalized UV-Vis absorption spectrum of the quantum dot are overlapped and a percentage of an overlapped area with respect to a total area of the normalized photoluminescent spectrum of the luminescent material may be greater than or equal to about 10%.

The percentage of an overlapped area with respect to a total area of the normalized photoluminescent spectrum of the luminescent material may be greater than or equal to about 30%.

The percentage of an overlapped area with respect to a total area of the normalized photoluminescent spectrum of the luminescent material may be greater than or equal to about 40%.

A difference between a first excitonic absorption peak wavelength of the quantum dot and a maximum photoluminescent peak wavelength of the luminescent material may be less than or equal to about 160 nm.

A maximum photoluminescent peak wavelength of the quantum dot may be present in a range of about 500 nm to about 540 nm and the difference between a first excitonic absorption peak wavelength of the quantum dot and a maximum photoluminescent peak wavelength of the luminescent material may be less than or equal to about 60 nm.

A maximum photoluminescent peak wavelength of the quantum dot may be present in a range of about 610 nm to about 640 nm and the difference between a first excitonic absorption peak wavelength of the quantum dot and a maximum photoluminescent peak wavelength of the luminescent material may be from about 110 nm to about 160 nm.

The luminescent material may include an anthracene compound, a naphthalene compound, a triazole compound, a phenoxazine compound, an acridine compound, a perylene compound, a coumarin compound, a porphyrin compound, a pyran compound, a pyrene compound, a fluorene compound, a fluorescein compound, a boron-dipyrromethene (BODIPY) compound, a polymer compound including a backbone including a thiophene moiety and a fluorene moiety, a green light emitting inorganic phosphor, or a combination thereof.

A weight ratio of the luminescent material with respect to the quantum dot may be greater than or equal to about $10^{-4}$:1 and less than or equal to about 0.1:1.

The polymer matrix may further include a cross-linked polymerization product of a multi-thiol compound having at least two thiol groups at its terminal ends and a photopolymerizable monomer including at least one carbon-carbon double bond such as a (meth)acrylate monomer.

The multi-thiol compound may include a compound represented by Chemical Formula 6:

Chemical Formula 6

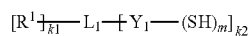

wherein, $R^1$ is hydrogen, a substituted or unsubstituted C1 to C40 (or C1 to C30) linear or branched alkyl group, a C2 to C40 (or C1 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C2 to C30 heterocycloalkyl group, a C1 to C10 alkoxy group, a hydroxy group, —NH₂, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, or a substituted or unsubstituted C2 to C30 alkylene group or a substituted or unsubstituted C3 to C30 alkenylene group wherein at least one methylene (—CH₂—) is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—CH₂—) is replaced by sulfonyl (—S(=O)₂—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of $Y_1$ when $Y_1$ is not a single bond, and provided that a sum of k1 and k2 does not exceed the valence of $L_1$.

The photosensitive composition may further include a metal oxide fine particle.

The metal oxide fine particle may include a titanium oxide, a silicon oxide, a barium oxide, a zinc oxide, or a combination thereof.

The metal oxide fine particle may include $TiO_2$, $SiO_2$, $BaTiO_3$, $Ba_2TiO_4$, ZnO, or a combination thereof.

The metal oxide fine particle may have an average particle size of greater than or equal to about 100 nm and less than or equal to about 1,000 nm.

In some embodiments, a layered structure includes a substrate (e.g., a transparent substrate); and a luminescent layer (e.g., photoluminescent layer) disposed on the substrate and including a pattern of the quantum dot polymer composite, the pattern of the quantum dot polymer composite includes a repeating section including a first section configured to emit light of a first light.

The repeating section may further include a second section configured to emit a second light that is different from the first light, a third section configured to emit a third light that is different from the first light and the second light, or a combination thereof.

At least one of the second section and the third section may include the quantum dot polymer composite.

A maximum photoluminescent peak wavelength of the first section may be in a range of greater than about 480 nm and less than or equal to about 580 nm or in a range of greater than about 580 nm and less than or equal to about 680 nm.

A maximum photoluminescent peak wavelength of the second section may be in a range of greater than about 480 nm and less than or equal to about 580 nm or in a range of greater than about 580 nm and less than or equal to about 680 nm.

A maximum photoluminescent peak wavelength of the third section may be in a range of greater than or equal to about 380 nm and less than or equal to about 480 nm.

In embodiments, an electronic device may include the quantum dot polymer composite. The electronic devices may include a light emitting diode (LED), an organic light emitting diode (OLED), a sensor, an imaging sensor, a solar cell, or a liquid crystal display device. In some embodiments, a display device include the aforementioned layered structure.

From the aforementioned photosensitive composition, a quantum dot-polymer composite pattern may be produced in an environmentally friendly manner. The photosensitive composition of the embodiments may be applied to a conventional photo-resist process without any additional surface treatment for the quantum dots.

The photosensitive composition of the embodiments may show improved storage stability and heat stability and a pattern prepared therefrom may show enhanced luminous efficiency even after a relatively high temperature heat-treatment carried out during a process involving a photoresist.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
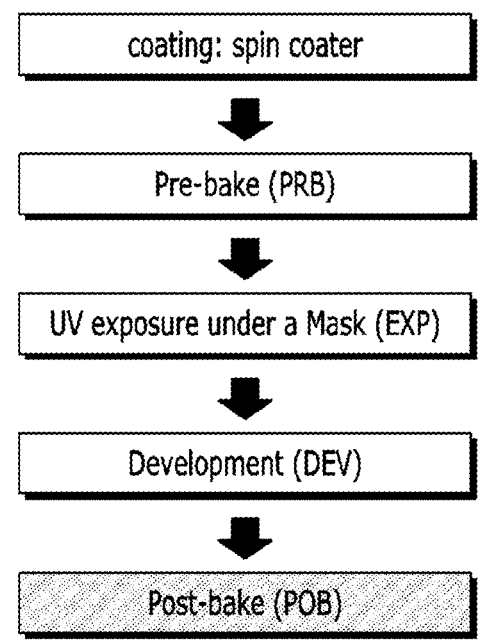
FIG. 1 is a schematic diagram illustrating an exemplary embodiment of a method of producing a quantum dot polymer composite pattern.
Figure 1:

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a compound or a group or a moiety wherein at least one hydrogen atom thereof is substituted with a substituent including a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., one to three) heteroatom(s) including N, O, S, Si, or P.

As used herein, when a definition is not otherwise provided, the term "alkylene group" refers to a straight or branched saturated aliphatic hydrocarbon group having a valence of at least two, optionally substituted with one or more substituents. As used herein, when a definition is not otherwise provided, the term "arylene group" refers to a functional group having a valence of at least two obtained by removal of at least two hydrogens in an aromatic ring, optionally substituted with one or more substituents.

As used herein, when a definition is not otherwise provided, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, when a definition is not otherwise provided, the term "(meth)acrylate" refers to acrylate and/or methacrylate. The (meth)acrylate can be a (C1 to C10 alkyl)acrylate or a (C1 to C10 alkyl)methacrylate.

As used herein, the term "hydrophobic moiety" refers to a moiety that causes a given compound including the same to show agglomeration in an aqueous solution and to have a tendency to repel water. For example, the hydrophobic moiety may include an aliphatic hydrocarbon group (alkyl, alkenyl, alkynyl, etc.) having at least one (at least two, three, four, five, or six, or higher) carbon atoms, an aromatic hydrocarbon group (phenyl, naphthyl, arylalkyl group, etc.) having at least six carbon atoms, or an alicyclic hydrocarbon group (cyclohexyl, norbornenyl, etc.) having at least five carbon atoms. The hydrophobic moiety substantially lacks ability to make a hydrogen bond with an ambient medium and is not substantially mixed with the medium as its polarity does not match that of the medium.

As used herein, the term "visible light" refers to light having a wavelength of about 390 nanometers (nm) to about 700 nm. As used herein, the term ultraviolet ("UV") may refer to light having a wavelength of greater than or equal to about 200 nm and less than about 390 nm.

As used herein, a photoconversion efficiency refers to a percentage of emission light relative to absorbed light from the incident light (e.g., blue light). For example, a photoconversion efficiency is a percentage of a light emission dose of a quantum dot polymer composite relative to absorbed light dose of the quantum dot polymer composite from excitation light (i.e., blue light). The total light dose (B) of excitation light may be obtained by integrating its photoluminescence ("PL") spectrum, the PL spectrum of the quantum dot polymer composite film is measured, a dose (A) of light in a green or red wavelength region emitted from the quantum dot polymer composite film and a dose (B') of blue light may be obtained therefrom, and a photoconversion efficiency, a quantum efficiency, and a blue absorption rate may be obtained by the following equation:

$$A/(B-B') \times 100\% = \text{photoconversion efficiency (\%)}$$

$$A/B = \text{quantum efficiency,}$$

$$(B-B')/B = \text{blue absorption rate.}$$

The percentage of the quantum efficiency to the blue absorption rate represents the photoconversion efficiency.

As used herein, when a definition is not otherwise provided, the term "dispersion" refers to a dispersion, wherein a dispersed phase is a solid and a continuous phase includes a liquid. For example, the term "dispersion" may refer to a colloidal dispersion wherein the dissolved or dispersed phase has a dimension of about 1 nm to about several micrometers (μm) (e.g., 1 μm or less, 2 μm or less, or 3 μm or less).

As used herein, when a definition is not otherwise provided, the term "Group" in the term Group III, Group II, and the like refers to a group of Periodic Table.

As used herein, "Group II" refers to Group IIA and a Group IIB, and examples of the Group II metal may include Cd, Zn, Hg, and Mg, but are not limited thereto.

"Group III" refers to a Group IIIA and a Group IIIB, and examples of the Group III metal may include Al, In, Ga, and TI, but are not limited thereto.

"Group IV" refers to a Group IVA and a Group IVB, and examples of the Group IV metal may include Si, Ge, and Sn but are not limited thereto. As used herein, the term "a metal" may include a semi-metal such as Si.

"Group I" refers to a Group IA and a Group IB, and may include Li, Na, K, Rb, and Cs but are not limited thereto.

"Group V" refers to Group VA and may include nitrogen, phosphorus, arsenic, antimony, and bismuth but is not limited thereto.

"Group VI" refers to Group VIA and may include sulfur, selenium, and tellurium, but is not limited thereto.

As used herein, the term "fluorophore" refers to a fluorescent compound (e.g., an organic fluorescent compound) capable of emitting or reemitting light by excitation. The fluorescent compound may include at least one, for example, at least two, at least three, at least four, or at least five aromatic groups or a planar or cyclic molecule having a plurality of π bonds. The fluorophore may be used alone without being linked (covalent bonded) to other material(s). The fluorophore may absorb light in a predetermined range of wavelengths and emit light having a longer wavelength. The fluorophore does not include a phosphor particle. The fluorophore may have a molecular weight of greater than or equal to about 100 g/mol and less than or equal to about 1,000 g/mol, but it is not limited thereto.

In an embodiment, a photosensitive composition includes: a (plurality of) quantum dot(s); a luminescent material other than a quantum dot; a carboxylic acid group (—COOH)-containing binder; a photopolymerizable monomer having at least one carbon-carbon double bond; and a photoinitiator. In the photosensitive composition of an embodiment, the plurality of quantum dots may be dispersed (for example, separated from one another) by the carboxylic acid group (—COOH)-containing binder to form a quantum dot dispersion. The quantum dot dispersion includes the carboxylic acid group (—COOH)-containing binder and the plurality of quantum dots dispersed in the carboxylic acid group (—COOH)-containing binder. The quantum dot dispersion may further include a solvent.

The quantum dot (hereinafter also referred to as a semiconductor nanocrystal) may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The Group II-VI compound may be selected from:
a binary element compound including CdSe, CdTe, ZnS, ZnSe, ZnTe, ZnO, HgS, HgSe, HgTe, MgSe, MgS, or a combination thereof;
a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and
a quaternary element compound including ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may be selected from:
a binary element compound including GaN, GaP, GaAs, GaSb, AlN, AlP, AlAs, AlSb, InN, InP, InAs, InSb, or a combination thereof;
a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and
a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal (e.g., InZnP).

The Group IV-VI compound may be selected from:
a binary element compound including SnS, SnSe, SnTe, PbS, PbSe, PbTe, or a combination thereof;
a ternary element compound including SnSeS, SnSeTe, SnSTe, PbSeS, PbSeTe, PbSTe, SnPbS, SnPbSe, SnPbTe, or a combination thereof; and
a quaternary element compound including SnPbSSe, SnPbSeTe, SnPbSTe, or a combination thereof.

Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may be selected from:
a single-element including Si, Ge, or a combination thereof; and
a binary element compound including SiC, SiGe, or a combination thereof.

In some embodiments, the quantum dot does not include cadmium.

The binary element compound, the ternary element compound, or the quaternary element compound may be respectively included in a uniform concentration in the particle or partially different concentrations in the same particle. The semiconductor nanocrystal particle may include a core including a first semiconductor nanocrystal and a shell disposed on at least a portion (or the entire) of a surface of the core and including a second semiconductor nanocrystal having a different composition from that of the first semiconductor nanocrystal. At the interface between the core and the shell, an alloyed interlayer may be present or may not be present. The alloyed layer may include a homogeneous alloy. The alloyed layer may have a concentration gradient. In the gradient alloy, the concentration of an element of the shell radially changes (e.g., decreases or increases toward the core). In addition, the shell may include a multi-layered shell having at least two layers wherein adjacent layers have different composition each other. In the multi-layered shell, each layer may have a single composition. In the multi-layered shell, each layer may have an alloy. In the multi-layered shell, each layer may have a concentration gradient that changes radially in light of a composition of a semiconductor nanocrystal.

In the core-shell semiconductor nanocrystal particle, the materials of the shell may have a bandgap energy that is larger than that of the core, but it is not limited thereto. The materials of the shell may have a bandgap energy that is smaller than that of the core. In the case of the multi-layered shell, the energy bandgap of the outermost layer material of the shell may be greater than those of the core and the inner layer material of the shell (a layer that is closer to the core). In the case of the multi-layered shell, a semiconductor nanocrystal of each layer is selected to have appropriate bandgap energy, thereby effectively showing a quantum confinement effect. Absorption and light emitting wavelength of the quantum dot may be controlled by varying a composition and/or a size thereof.

A maximum photoluminescent peak wavelength of the quantum dot may be greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, greater than or equal to about 610 nm. A maximum photoluminescent peak wavelength of the quantum dot may be less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. A maximum photoluminescent peak wavelength of the quantum dot may be present in a range of about 500 nm to about 650 nm. A maximum photoluminescent peak wavelength of the (e.g., green light emitting) quantum dot may be present in a range of about 500 nm to about 540 nm. A maximum photoluminescent peak wavelength of the (e.g., red light emitting) quantum dot may be present in a range of about 610 nm to about 640 nm.

The quantum dot may have a quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%. The quantum dot may have a full width half maximum (FWHM) of less than or equal to about 45 nm, for example less than or equal to about 40 nm, or less than or equal to about 30 nm.

The quantum dot may have a size (e.g., particle diameter or in the case of a non-spherically shaped particle, a diameter calculated from a two dimensional area of an electron microscopic image of the particle) of about 1 nm to about 100 nm. In some embodiments, the quantum dot may have a particle diameter of about 1 nm to about 50 nm, for example, from 2 nm (or from 3 nm) to 35 nm. In some embodiments, the quantum dot have a diameter of greater than or equal to about 1 nm, greater than or equal to about 2 nm, greater than or equal to about 3 nm, greater than or equal to about 4 nm, or greater than or equal to about 5 nm. In some embodiments, the quantum dot have a diameter of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

Shapes of the quantum dot are not particularly limited. For example, the shape of the quantum dot may include a sphere, a polyhedron, a pyramid, a multi-pod, a cubic, a rectangular parallelepiped, a nanotube, a nanowire, a nanosheets, a nanorod, or a combination thereof, but are not limited thereto.

The quantum dot may be commercially available or may be synthesized in any method. In a colloidal synthesis, a particle size of the quantum dot may relatively easily controlled and a distribution of the size may be uniformly controlled. During the colloidal synthesis, precursors may react in an organic solvent to grow nanocrystal particles, and the organic solvent or a ligand compound may coordinate (or be bound) to a surface of the quantum dot, thereby controlling the growth of the nanocrystal. Examples of the organic solvent and ligand compound are known.

After the synthesis, an extra, e.g., excess, amount of organics (e.g., organic solvents and/or organic ligands) that are not coordinated (or bound) to a surface of the quantum dot may be removed by a re-precipitation process using an excess amount of a non-solvent. Examples of the non-solvent include acetone, ethanol, methanol, and the like, but are not limited thereto.

The quantum dot may include an organic ligand having a hydrophobic moiety and not having a photopolymerizable moiety such as a (meth)acrylate or a vinyl moiety for example at its terminal ends. The organic ligand may be bound to a surface of the quantum dot. In an embodiment, the organic ligand may include RCOOH, $RNH_2$, $R_2NH$, $R_3N$, $R_3PO$, $R_3P$, ROH, RCOOR', $RPO(OH)_2$, $R_2POOH$ (wherein R and R' are the same or different, and are independently a hydrogen, C1 to C40 aliphatic hydrocarbon such as C1 to C40 or C5 to C24 alkyl group or a C1 to C40 or C5 to C24 alkenyl group or a C6 to C40 aromatic hydrocarbon such as a C5 to C20 aryl group, or a combination thereof, provided that at least one R group in each ligand is not hydrogen), a polymeric organic ligand, or a combination thereof.

Examples of the organic ligand compound may include:

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

phosphine compounds such as methyl phosphine, ethyl phosphine, propyl phosphine, butyl phosphine, pentyl phosphine, octyl phosphine, dioctyl phosphine, tributyl phosphine, or trioctyl phosphine;

phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide;

diphenyl phosphine, triphenyl phosphine, or oxide compounds thereof;

a C5 to C20 mono- or di(alkyl)phosphinic acid such as mono- or dihexylphosphinic acid, mono- or dioctylphosphinic acid, mono- or didodecylphosphinic acid, mono- or di(tetradecyl)phosphinic acid, mono- or di(hexadecyl)phosphinic acid, or mono- or di(octadecyl)phosphinic acid;

a C5 to C20 alkylphosphonic acid such as hexylphosphonic acid, octylphosphonic acid, dodecylphosphonic acid, tetradecylphosphonic acid, hexadecylphosphonic acid, or octadecylphosphonic acid;

and the like, but are not limited thereto.

In some embodiments, the quantum dot may further include a single (hydrophobic) organic ligand or at least two (hydrophobic) organic ligands selected from the foregoing. The hydrophobic organic ligand may not include a photopolymerizable moiety.

In some embodiments, the amount of the quantum dot may be greater than or equal to about 1 percent by weight (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt %, based on the total amount of the composition. The amount of the quantum dot may be less than or equal to about 60 wt %, for example, less than or equal to about 55 wt %, less than or equal to about 50 wt %, less than or equal to about 45 wt %, less than or equal to about 40 wt %, or less than or equal to about 35 wt %, based on the total amount of the composition.

For example, based on a total weight of the composition including a solvent, an amount of the quantum dot having an organic ligand may be greater than or equal to about 1 percent by weight (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt %. Based on a total weight of the composition including a solvent, an amount of the quantum dot having an organic ligand may be less than or equal to about 60 wt %, for example, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 16 wt %, or less than or equal to about 15 wt %.

In some embodiments, based on a total weight of solid contents of the composition (i.e., non-volatiles or a composite that will be described below), the amount of the quantum dot may be greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt % or greater than or equal to about 30 wt %. Based on a total weight of solid contents of the composition (i.e., non-volatiles or a composite that will be described below), the amount of the quantum dot may be less than or equal to about 70 wt %, for example, less than or equal to about 65 wt %, less than or equal to about 60 wt %, less than or equal to about 55 wt %, less than or equal to about 50 wt %, or less than or equal to about 45 wt %.

The composition of the embodiments further includes a luminescent material other than the quantum dot. The luminescent material may include a fluorophore, a nanosized inorganic phosphor, or a combination thereof. A maximum absorption peak wavelength (λmax) of the luminescent material may be greater than or equal to about 350 nm greater than or equal to about 400 nm, for example, greater than or equal to about 410 nm, greater than or equal to about 420 nm, greater than or equal to about 430 nm, greater than or equal to about 440 nm, greater than or equal to about 450 nm, or greater than or equal to about 460 nm. A maximum absorption peak wavelength (λmax) of the luminescent material may be less than or equal to about 510 nm, less than or equal to about 500 nm, less than or equal to about 490 nm, less than or equal to about 480 nm, or less than or equal to about 470 nm. The maximum absorption peak wavelength (λmax) of the luminescent material may be determined by a UV-Vis spectroscopy analysis of a solution (e.g., an aqueous solution or an organic solution) including the luminescent material. The weight ratio of the luminescent material with respect to the quantum dot (the weight of the luminescent material:the weight of the quantum dot) may be greater than or equal to about $10^{-4}$:1, for example, greater than or equal to about $2 \times 10^{-4}$:1, greater than or equal to about $3 \times 10^{-4}$:1, greater than or equal to about $4 \times 10^{-4}$:1, greater than or equal to about $5 \times 10^{-4}$:1, greater than or equal to about $6 \times 10^{-4}$:1, greater than or equal to about $7 \times 10^{-4}$:1, greater than or equal to about $8 \times 10^{-4}$:1, greater than or equal to about $9 \times 10^{-4}$:1, greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, greater than or equal to about 0.007:1, greater than or equal to about 0.008:1, greater than or equal to about 0.009:1, or greater than or equal to about 0.01:1. The weight ratio of the luminescent material with respect to the quantum dot may be less than or equal to about 0.1:1, less than or equal to about 0.09:1, less than or equal to about 0.08:1, less than or equal to about 0.07:1, less than or equal to about 0.06:1, less than or equal to about 0.05:1, or less than or equal to about 0.04:1.

The luminescent material may be selected to allow the quantum dot to absorb at least a portion of light emitted from the luminescent material. In some embodiments, the photoluminescent spectrum of the luminescent material may be overlapped with the UV-Vis absorption spectrum of the quantum dot. In some embodiments, a normalized photoluminescent spectrum of the luminescent material and a normalized UV-Vis absorption spectrum of the quantum dot are overlapped and a percentage of an overlapped area with respect to a total area of the normalized photoluminescent spectrum of the luminescent material may be greater than or equal to about 10%. The normalization of the UV-Vis absorption spectrum of the quantum dot may be carried out with respect to an intensity of a first excitonic absorption peak of the UV-Vis absorption spectrum. The normalization of the photoluminescent spectrum of the luminescent material may be made with respect to an intensity of a maximum PL peak. The percentage of an overlapped area with respect to a total area of the normalized photoluminescent spectrum of the luminescent material may be greater than or equal to about 30%. The percentage of an overlapped area with respect to a total area of the normalized photoluminescent spectrum of the luminescent material may be greater than or equal to about 40%.

In some embodiments, a first excitonic absorption peak wavelength of the quantum dot may be greater than a maximum photoluminescent peak wavelength of the luminescent material. In some embodiments, a difference between a first excitonic absorption peak wavelength of the quantum dot and a maximum photoluminescent peak wavelength of the luminescent material may be less than or equal to about 160 nm. In some embodiments, a maximum photoluminescent peak wavelength of the quantum dot may be present in a range of about 500 nm to about 540 nm and the difference between a first excitonic absorption peak wavelength of the quantum dot and a maximum photoluminescent peak wavelength of the luminescent material may be less than or equal to about 60 nm. In some embodiments, a maximum photoluminescent peak wavelength of the quantum dot may be present in a range of about 610 nm to about 640 nm and the difference between a first excitonic absorption peak wavelength of the quantum dot and a maximum photoluminescent peak wavelength of the luminescent material may be from about 110 nm to about 160 nm.

A liquid crystal display is based on a theory wherein a polarized light from a liquid crystal layer passes through an absorption color filter to produce a predetermined colored light. Such display devices tend to have a relatively narrow viewing angle. In addition, as the absorption type color filter has a light transmission rate of about 33% even at an ideal state, it may be difficult to avoid substantial loss of brightness. A display device including a photoluminescent type color filter instead of the absorption type color filter is expected to have a wider viewing angle and enhanced brightness. The quantum dot may have a theoretical quantum yield (QY) of about 100%, and may emit light having high color purity (e.g., a full width at half maximum (FWHM) of less than or equal to about 40 nm), and thus it may achieve the enhanced luminous efficiency and the improved color reproducibility. Accordingly, it is believed that using a color filter including a quantum dot polymer composite may allow realizing a display having high brightness, a wide viewing angle, and high color reproducibility. However, a quantum dot based color filter may hardly have an absorption rate of excitation (e.g., blue) light of less than about 100% and a blue light transmittance of 0%. In particular, most of the quantum dot based color filter has a relatively low level of a blue light absorption rate, which may be an additional hurdle against the improvement of the brightness.

In order to address such problems, a quantum dot based color filter may further include an additional element such as a blue cut filter or a yellow photoresist (YPR) that is configured to transmit a desired light (e.g., a red or green light) and to absorb (or reflect) blue light thereon. However, the inclusion of the additional element may cause an additional decrease in the light efficiency and/or an increase in a production cost. Meanwhile, a photoconversion efficiency is a type of factor for evaluating the efficiency and performance of the quantum dot color filter. The photoconversion efficiency may be defined as a percentage of the quantum efficiency with respect to the blue light absorption rate. According to such a definition, an increase in the blue absorption rate may lead to a decrease in the photoconversion efficiency.

The quantum dot polymer composite prepared from the aforementioned photosensitive composition of the embodiments includes a predetermined amount (e.g., a small or limited amount) of the luminescent material (other than a quantum dot) together with the quantum dot, and thereby it may show increased absorption rate of the excitation light and enhanced photoconversion efficiency at the same time. The quantum dot polymer composite may not have any substantial effect on desired properties (e.g., photoluminescent wavelength and the FWHM) of the light emitted from the color filter. Without wishing to be bound any theory, in the photosensitive composition of the embodiments, the luminescent material having the foregoing features may contribute the absorption of the excitation light and the light emitted from the luminescent material may also contribute the light emission of the quantum dot. Moreover, in the photosensitive composition of the embodiments, the luminescent material may not deteriorate the dispersability of the photosensitive composition, ensuring the pattern forming ability.

The fluorophore may include a dye, a pigment, or a combination thereof. The fluorophore may include an organic luminescent type dye. The luminescent material may include an anthracene compound (an anthracene dye) such as bis(phenylethynyl)anthracene, 9,10-Bis[N,N-di-(p-tolyl)-amino]anthracene, 9,10-bis[phenyl(m-tolyl)-amino]anthracene, N10,N10'-diphenyl-N10,N10'-dinaphthalenyl-9,9'-bianthracene-10,10'-diamine, a naphthalene compound such as 4,4'-(1E,1'E)-2,2'-(naphthalene-2,6-diyl)bis(ethene-2,1-diyl)bis(N,N-bis(4-hexylphenyl)aniline), a triazole compound such as 10,10'-(4,4'-(4-phenyl-4H-1,2,4-triazole-3,5-diyl)bis(4,1-phenylene))bis(10H-phenoxazine), a phenoxazine compound such as 10,10'-(4,4'-sulfonylbis(4,1-phenylene))bis(10H-phenoxazine), an acridine compound such as 10-phenyl-10H,10'H-spiro[acridine-9,9'-anthracen]-10'-one, a perylene compound such as 2,5,8,11-tetra-tert-butylperylene, a coumarin compound (dye) such as coumarin 6, coumarin 7, coumarin 153, coumarin 30, coumarin, 314, coumarin 343, coumarin 334, coumarin 466, poly[(methyl methacrylate)-co-(7-(4-trifluoromethyl)coumarin acrylamide)], coumarin 545, a porphyrin compound such as tetrabenzoporphyrine, a pyran compound such as 4-(dicyanomethylene)-2-methyl-6-(4-dimethylaminostyryl)-4H-pyran, a pyrene compound, a fluorene compound such as poly[(9,9-dioctyl-2,7-divinylenefluorenylene)-alt-(1,4-phenylene)] and poly[(9,9-di-n-octylfluorenyl-2,7-diyl)-alt-2,2'-bithiophene-5,5'-diyl)], a thiophene compound such as tris(4-(5-phenylthiophen-2-yl)phenyl)amine, a fluorescein compound, a boron-dipyrromethene (BODIPY) compound, and a green light emitting inorganic phosphor such as BaSiO:Eu, SrSiO:Eu, SrAlO:Eu, SrAlO:Eu, SrGaS:Eu (e.g., $SrGa_2S_4:Eu^{2+}$), SrSiAlON:Eu, (Ca,Sr,Ba)SiNO:Eu, (Ca,Sr, or Ba)SiO$_4$:Eu, YSiON:Tb, YSiON:Tb, GdSiON:Tn, or a combination thereof. As used herein, the fluorene compound or the thiophene compound may be a polymer, for example a polymer compound having a backbone including a thiophene moiety and a fluorene moiety (e.g., poly[(9,9-di-n-octylfluorenyl-2,7-diyl)-alt-2,2'-bithiophene-5,5'-diyl)], also known as poly(9,9-dioctylfluorene-co-bithiophene) copolymer (e.g., an alternating copolymer)), a polymer compound having a backbone including a phenylene moiety and a fluorene moiety (e.g., poly[(9,9-dioctyl-2,7-divinylenefluorenylene)-alt-(1,4-phenylene)] as named above), or a combination thereof.

The inorganic phosphor may have a size of less than or equal to about 3 micrometers (μm), for example, less than or equal to about 2 μm. The inorganic phosphor may include a nanometer sized phosphor. The nanometer sized phosphor may have a size of less than or equal to about 1,000 nm, for example, less than or equal to about 900 nm, less than or equal to about 800 nm, less than or equal to about 700 nm, or less than or equal to about 600 nm. The nanometer sized phosphor may have a size of greater than or equal to about 5 nm, greater than or equal to about 10 nm, greater than or equal to about 20 nm, greater than or equal to about 30 nm, greater than or equal to about 40 nm, greater than or equal to about 50 nm, greater than or equal to about 60 nm, greater than or equal to about 70 nm, greater than or equal to about 80 nm, greater than or equal to about 90 nm, or greater than or equal to about 100 nm.

In the composition of the embodiments, the luminescent material may provide an increased optical density with the composition. The quantum dot polymer composite may improve both the absorption rate of the excitation light and the photoconversion efficiency at the same time without having a substantially adverse (e.g., unwanted) effect on the luminous properties thereof.

In the photosensitive composition, based on a total weight of the composition (e.g., including a solvent), an amount of the luminescent material may be greater than or equal to about $10^{-4}$ wt %, greater than or equal to about $2\times10^{-4}$ wt %, greater than or equal to about $3\times10^{-4}$ wt %, greater than or equal to about $4\times10^{-4}$ wt %, greater than or equal to about $5\times10^{-4}$ wt %, greater than or equal to about $6\times10^{-4}$ wt %, greater than or equal to about $7\times10^{-4}$ wt %, greater than or equal to about $8\times10^{-4}$ wt %, greater than or equal to about $9\times10^{-4}$ wt %, greater than or equal to about 0.001 wt %, greater than or equal to about 0.002 wt %, greater than or equal to about 0.003 wt %, greater than or equal to about 0.004 wt %, greater than or equal to about 0.005 wt %, greater than or equal to about 0.006 wt %, greater than or equal to about 0.007 wt %, greater than or equal to about 0.008 wt %, greater than or equal to about 0.009 wt %, greater than or equal to about 0.01 wt %, greater than or equal to about 0.02 wt %, greater than or equal to about 0.03 wt %, greater than or equal to about 0.04 wt %, greater than or equal to about 0.05 wt %, greater than or equal to about 0.06 wt %, greater than or equal to about 0.07 wt %, greater than or equal to about 0.08 wt %, greater than or equal to about 0.09 wt %, or greater than or equal to about 0.1 wt %. In the photosensitive composition of the embodiments, based on a total weight of the composition (e.g., including a solvent), an amount of the luminescent material may be less than or equal to about 6 wt %, less than or equal to about 5 wt %, less than or equal to about 4 wt %, less than or equal to about 3 wt %, less than or equal to about 2.5 wt %, less than or equal to about 2 wt %, less than or equal to about 1.9 wt %, less than or equal to about 1.8 wt %, less than or equal to about 1.7 wt %, less than or equal to about 1.5 wt %, less than or equal to about 1.4 wt %, less than or equal to about 1.3 wt %, less than or equal to about 1.2 wt %, less than or equal to about 1 wt %, less than about 1 wt %, less than or equal to about 0.9 wt %, less than or equal to about 0.8 wt %, less than or equal to about 0.7 wt %, or less than or equal to about 0.5 wt %.

The photosensitive composition of the embodiments may include a relatively large amount of the quantum dots (e.g., at least 5 wt % or even at least about 10 wt % of the quantum dots based on the solid content of the composition). The carboxylic acid group-containing binder may contribute to dispersing the quantum dots in the photosensitive composition. For example, when the quantum dots are mixed with the alkali-developable photoresist without performing any surface treatment, they tend to seriously aggregate. However, the aforementioned carboxylic acid group containing binder may significantly enhance dispersion stability of the quantum dots in an alkali-developable photosensitive composition.

In the photosensitive composition according to an embodiment, the quantum dot including an organic ligand (e.g., having a hydrophobic moiety) on the surface is first dispersed in the solution of the carboxylic acid group-containing binder having a hydrophobic moiety to obtain a quantum dot-binder dispersion. The obtained quantum dot-binder dispersion is then mixed with the other components for a photoresist. In the case of the photosensitive composition thus obtained, (for example, a relatively large amount of) the quantum dots may be well dispersed (e.g., individually distributed) in an alkaline developable photoresist without any serious aggregation. Without wishing to be bound by any theory, it is understood that when the quantum dots are dispersed in the solution of the carboxylic acid group-containing binder having a hydrophobic moiety, the binder may facilitate the formation of the dispersion including the quantum dots, and the quantum dots dispersed with the help of the binder may maintain their dispersed state even when they constitute a photoresist composition.

Therefore, the photosensitive composition of the embodiments includes a quantum dot dispersion that includes a carboxylic acid group-containing binder and a plurality of the quantum dots dispersed (e.g., separated from one another) in the binder. The photosensitive composition of the embodiments may provide a quantum dot polymer composite pattern even when a surface of the quantum dot does not have a photopolymerizable functional group (e.g., a (meth) acrylate group) and thus, a surface treatment may be omitted and a pattern-developing process may be made without using an organic solvent such as NMP or toluene.

The carboxylic acid group containing binder may have an acid value of greater than or equal to about 50 mg KOH/g and less than or equal to about 250 mg KOH/g. The carboxylic acid group containing binder may have an acid value of greater than or equal to about 100 mg KOH/g and less than or equal to about 200 mg KOH/g.

In the composition of the embodiments, the carboxylic acid group containing binder may include:

a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multiple aromatic ring-containing polymer including a carboxylic acid group (—COOH) and having a backbone structure in a main chain (e.g., a backbone structure incorporated in the main chain), wherein the backbone structure includes a quaternary carbon atom, which is a part of a cyclic group, and two aromatic rings bound to the quaternary carbon atom;

or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 1-1, a unit represented by Chemical Formula 1-2, or a combination thereof:

Chemical Formula 1-1

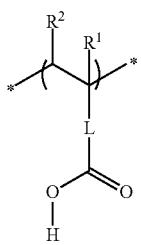

wherein
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a divalent C1 to C15 aliphatic hydrocarbon group such as a C1 to C3 alkylene group, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, and
* indicates a portion linked to an adjacent atom;

Chemical Formula 1-2

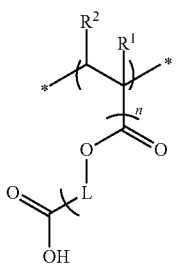

wherein $R^1$ is hydrogen, a C1 to C3 alkyl group, or —$(CH_2)_m$—COOH (wherein m is 0 to 2),
$R^2$ is hydrogen or a C1 to C3 alkyl group,
L is a single bond, a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
n is an integer of 1 to 3, and
* indicates a portion linked to an adjacent atom.

As used herein, examples of the C6 to C30 alicyclic group include a cycloalkyl group such as a cyclohexyl group and a norbornyl group, a cycloalkenyl group such as a norbornenyl group, a cycloalkylene group such as a cyclohexylene group and a norbornane moiety, a cycloalkenylene group such as a cyclohexenylene group and a norbornene group, but are not limited thereto. As used herein, examples of the C6 to C30 aromatic hydrocarbon group includes a C6 to C30 aryl group such as a phenyl group, a naphthyl group, and the like, and a C6 to C30 arylene group, but are not limited to. As used herein, examples of the aliphatic hydrocarbon include for example C1 to C15 alkyl group and C1 to C15 alkylene group, but are not limited thereto.

The second repeating unit may include a unit represented by Chemical Formula 2, a unit represented by Chemical Formula 4, a unit represented by Chemical Formula 5, a unit represented by Chemical Formula A, or a combination thereof:

Chemical Formula 2

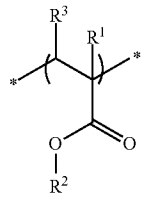

wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group (e.g., an arylalkyl group),
$R^3$ is hydrogen or a C1 to C3 alkyl group, and
* indicates a portion linked to an adjacent atom;

Chemical Formula 4

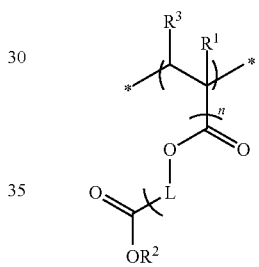

wherein
$R^1$ is hydrogen or a C1 to C3 alkyl group,
L is a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group,
n is an integer of 1 to 3, and
* indicates a portion linked to an adjacent atom;

Chemical Formula 5

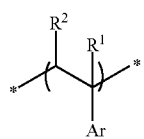

wherein
each of $R^1$ and $R^2$ is independently hydrogen or a C1 to C3 alkyl group,
Ar is a substituted or unsubstituted C6 to C30 aromatic hydrocarbon group or a substituted or unsubstituted C3 to C30 alicyclic hydrocarbon group, and
* indicates a portion linked to an adjacent atom;

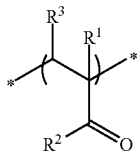

Chemical Formula A wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group, and
* indicates a portion linked to an adjacent atom.

The third repeating unit derived from the third monomer may be represented by Chemical Formula 3:

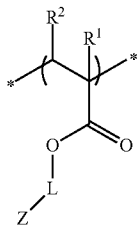

Chemical Formula 3 wherein
each of $R^1$ and $R^2$ is independently hydrogen or a C1 to C3 alkyl group,
L is a C1 to C15 alkylene group, a C1 to C15 alkylene group wherein at least one methylene group is replaced with —C(=O)—, —O—, —C(=O)O—, or a combination thereof, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
Z is a hydroxyl group (—OH), a mercapto group (—SH), or an amino group (—NHR, wherein R is hydrogen or a C1 to C5 alkyl group) and
* indicates a portion linked to an adjacent atom.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds, e.g., two more different compounds.

Examples of the second monomer may include, but are not limited to:
alkenyl aromatic compounds such as styrene, a-methyl styrene, vinyl toluene, or vinyl benzyl methyl ether;
unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;
unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;
maleimides such as N-phenylmaleimide, N-benzylmaleimide, or N-alkylmaleimide;
unsaturated carboxylic acid glycidyl ester compounds such as glycidyl acrylate or glycidyl methacrylate;
vinyl cyanide compounds such as acrylonitrile or methacrylonitrile; and
unsaturated amide compounds such as acrylamide or methacrylamide,
but are not limited thereto.

As the second monomer, at least one compound may be used, e.g., two or more different compounds may be used.

If present, examples of the third monomer may include 2-hydroxy ethyl acrylate, 2-hydroxy ethyl methacrylate, hydroxy propyl acrylate, hydroxy propyl methacrylate, hydroxy butyl acrylate, and hydroxy butyl methacrylate, but are not limited thereto. The third monomer may include one or more compounds, e.g., two or more different compounds may be used.

In an embodiment, the binder polymer may be a copolymer of (meth)acrylic acid and at least one second or third monomer including an arylalkyl(meth)acrylate, hydroxyalkyl (meth)acrylate, or styrene.

In some embodiments, an amount of the first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder polymer, an amount of the first repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the binder polymer, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the third repeating unit derived from the third monomer, when present, may be greater than or equal to about 1 mol %, for example, greater than or equal to about 5 mol %, greater than or equal to about 10 mol %, or greater than or equal to about 15 mol %. In the binder polymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

For example, the binder polymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, or a (meth)acrylic acid/benzyl (meth)acrylate/styrene/2-hydroxy ethyl (meth)acrylate copolymer.

In an embodiment, the binder polymer may include a multiple aromatic ring-containing polymer. The multiple aromatic ring-containing polymer may include a carboxylic acid group (—COOH) and a main chain including a backbone structure incorporated therein, wherein the backbone structure includes a quaternary carbon atom, which is a part of a cyclic group, and two aromatic rings bound to the quaternary carbon atom. The carboxylic acid group may be bonded to the main chain.

In the multiple aromatic ring-containing polymer, the backbone structure may include a repeating unit represented by Chemical Formula B

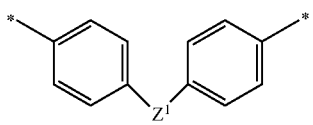

Chemical Formula B wherein
* indicates a portion that is linked to an adjacent atom of the main chain of the binder,
$Z^1$ is a linking moiety represented by any one of Chemical Formulae B-1 to B-6, and in Chemical Formulae B-1 to B-6, * indicates a portion that is linked to an adjacent atom in the aromatic ring:

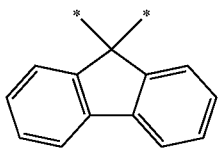

Chemical Formula B-1

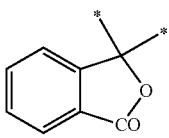

Chemical Formula B-2

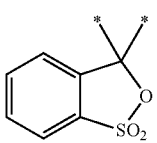

Chemical Formula B-3

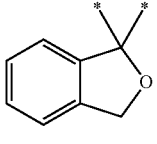

Chemical Formula B-4

Chemical Formula B-5

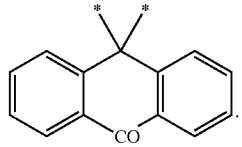

Chemical Formula B-6 wherein $R^a$ is hydrogen, an ethyl group, $C_2H_4Cl$, $C_2H_4OH$, $CH_2CH=CH_2$, or a phenyl group, The multiple aromatic ring-containing polymer may include a structural unit represented by Chemical Formula C:

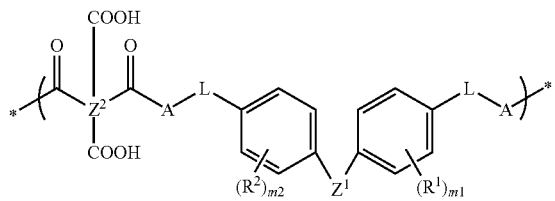

Chemical Formula C wherein
$Z^1$ is a linking moiety represented by any one of Chemical Formulae B-1 to B-6,
L is a single bond, a C1 to C10 alkylene, a C1 to C10 alkylene having a substituent including a carbon-carbon double bond, a C1 to C10 oxyalkylene, or a C1 to C10 oxyalkylene having a substituent including a carbon-carbon double bond,
A is —NH—, —O—, a C1 to C10 alkylene, or a combination thereof,
each of $R^1$ and $R^2$ is independently hydrogen, a halogen, or a substituted or unsubstituted C1 to C20 alkyl group,
m1 and m2 are the same or different, and are independently an integer ranging from 0 to 4,
$Z^2$ is a C6 to C40 aromatic organic group, and
* indicate a portion that is linked to an adjacent atom.

In Chemical Formula C, $Z^2$ may be any one of Chemical Formula C-1, Chemical Formula C-2, and Chemical Formula C-3:

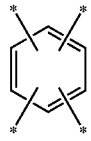

Chemical Formula C-1 wherein * indicates a portion that is linked to an adjacent carbonyl carbon,

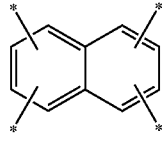

Chemical Formula C-2 wherein * indicates a portion that is linked to an adjacent carbonyl carbon,

Chemical Formula C-3

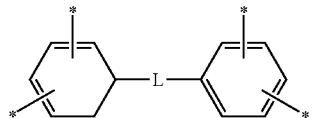

wherein * indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein each R is independently hydrogen, a C1 to C10 aliphatic hydrocarbon group, a C6 to C20 aromatic hydrocarbon group, or a C3 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula D:

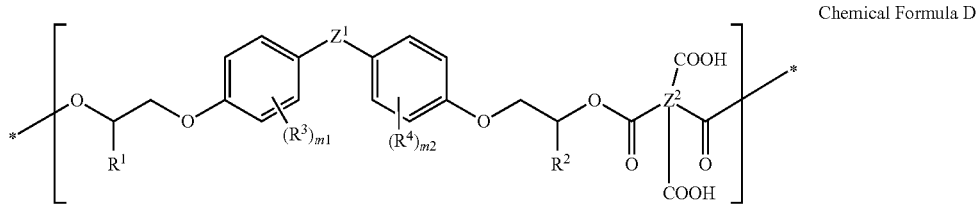

Chemical Formula D wherein
each of R$^1$ and R$^2$ is independently hydrogen or a substituted or unsubstituted (meth)acryloyloxyalkyl group,
each of R$^3$ and R$^4$ is independently hydrogen, a halogen, or a substituted or unsubstituted C1 to C20 alkyl group,
Z$^1$ is a linking moiety represented by any of Chemical Formulae A-1 to A-6,
Z$^2$ is an aromatic organic group such as the moieties set forth above,
m1 and m2 are the same or different, and are independently an integer ranging from 0 to 4, and
* indicates a portion that is linked to an adjacent atom.

In some embodiments, the multiple aromatic ring-containing polymer may be an acid adduct of a bisphenol fluorene epoxy acrylate monomer. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as below:

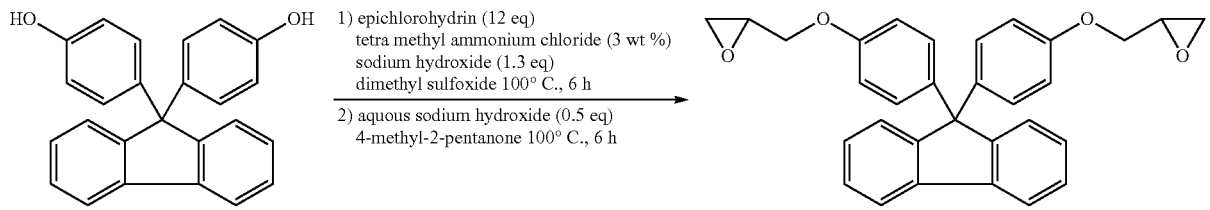

1) epichlorohydrin (12 eq)
tetra methyl ammonium chloride (3 wt %)
sodium hydroxide (1.3 eq)
dimethyl sulfoxide 100° C., 6 h 2) aqueous sodium hydroxide (0.5 eq)
4-methyl-2-pentanone 100° C., 6 h

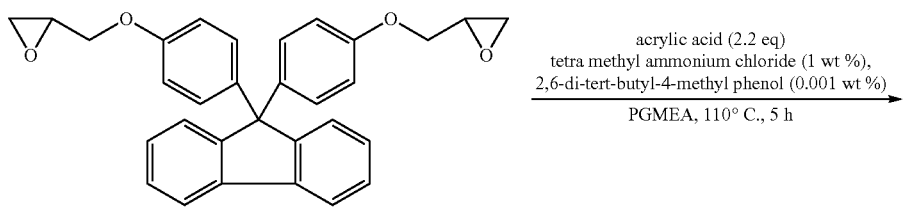

acrylic acid (2.2 eq)
tetra methyl ammonium chloride (1 wt %),
2,6-di-tert-butyl-4-methyl phenol (0.001 wt %)
PGMEA, 110° C., 5 h

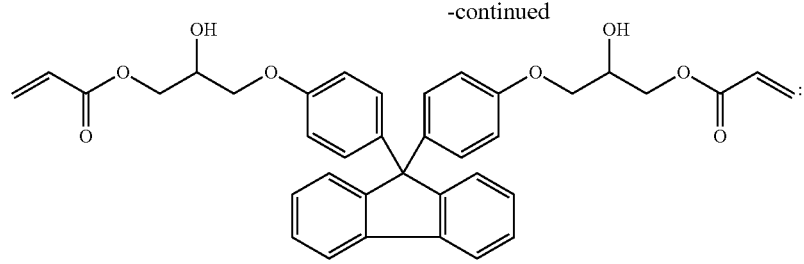

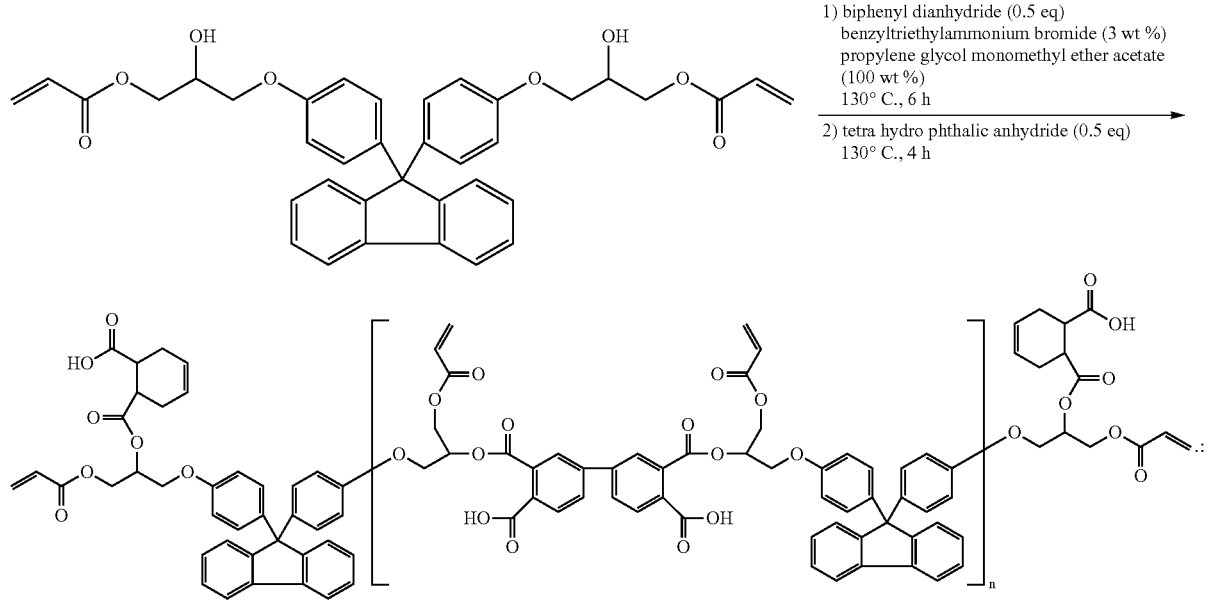

The multiple aromatic ring-containing polymer may include a functional group represented by Chemical Formula E at one or both terminal ends:

Chemical Formula E

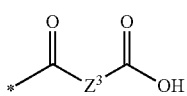

wherein
* indicates a portion that is linked to an adjacent atom, and
$Z^3$ is a moiety represented by one of Chemical Formulae E-1 to E-7:

Chemical Formula E-1

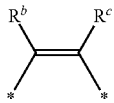

wherein each of $R^b$ and $R^c$ is independently hydrogen, a substituted or unsubstituted C1 to C20 alkyl group, a substituted or unsubstituted C1 to C20 alkyl group wherein at least one methylene is replaced with an ester group, an ether group, or a combination thereof, and
* indicates a portion that is linked to an adjacent atom.

Chemical Formula E-2

Chemical Formula E-3

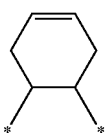

Chemical Formula E-4

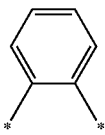

Chemical Formula E-5

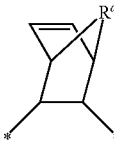

wherein $R^d$ is O, S, NH, a substituted or unsubstituted C1 to C20 alkylene group, a C1 to C20 alkylamine group, or a C2 to C20 alkenylamine group.

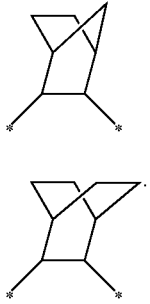

Chemical Formula E-6

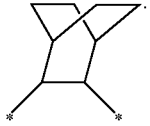

Chemical Formula E-7

The multiple aromatic ring-containing polymer may be synthesized by a known method or is commercially available (e.g., from Nippon Steel Chemical Co., Ltd.).

As non-limiting examples, the multiple aromatic ring-containing polymer may include a structural unit derived from a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, 9,9-bis-(3,4-dicarboxyphenyl)fluorene dianhydride, or a combination thereof, with an appropriate compound capable of reacting with the fluorene compound. The appropriate compound capable of reacting with the fluorene compound may include, but is not limited to, an aromatic dianhydride such as pyromellitic dianhydride (PMDA), biphenyltetracarboxylic dianhydride (BPDA), benzophenone tetracarboxylic dianhydride, and naphthalene tetracarboxylic dianhydride; a C2 to C30 diol compound; epichlorohydrin; or a combination thereof.

The fluorene compound, the dianhydrides, the diol compound, and the like are commercially available, and the reaction conditions therebetween are known in the art.

The binder polymer (e.g., containing the carboxylic acid group) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 90,000 g/mol, less than or equal to about 80,000 g/mol, less than or equal to about 70,000 g/mol, less than or equal to about 60,000 g/mol, less than or equal to about 50,000 g/mol, less than or equal to about 40,000 g/mol, less than or equal to about 30,000 g/mol, less than or equal to about 20,000 g/mol, or less than or equal to about 10,000 g/mol.

In the composition, an amount of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on the total weight of the composition. An amount of the binder polymer may be less than or equal to about 60 wt %, for example, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %, based on the total weight of the composition.

In an embodiment, an amount of the binder polymer may be greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, or greater than or equal to about 8 wt %, based on the total weight of solids (i.e., non-volatiles) of the composition. In an embodiment, an amount of the binder polymer may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, or less than or equal to about 35 wt %, based on the total weight of solids (i.e., non-volatiles) of the composition. While not wishing to be bound by theory, it is understood that within the aforementioned range, dispersibility of the quantum dots may be ensured while an appropriate level of developing and process properties may be achieved.

The photosensitive composition according to an embodiment includes a photopolymerizable monomer having at least one (e.g., two, three, four, five, six, or more) carbon-carbon double bond (e.g., an acrylate group or a methacrylate group). Types of the photopolymerizable monomer are not particularly limited as long as they include a carbon-carbon double bond and may be polymerized by light. For example, the photopolymerizable monomer may be a monomer or an oligomer that may be used in a photosensitive composition. The photopolymerizable monomer may include a monofunctional or multi-functional ester of (meth) acrylic acid having at least one ethylenic unsaturated double bond. For example, the photopolymerizable monomer may include a vinyl monomer, an unsaturated ethylenic oligomer, a homopolymer thereof, a copolymer of the unsaturated ethylenic oligomer and an ethylenic unsaturated monomer, or a combination thereof.

Examples of the photopolymerizable monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth) acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth) acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, and the like. The photopolymerizable monomer of the embodiments may include a di(meth)acrylate compound, a tri(meth)acrylate compound, a tetra(meth)acrylate compound, a penta(meth)acrylate compound, a hexa(meth) acrylate compound, or a combination thereof.

In the photosensitive composition, the amount of the photopolymerizable monomer may be greater than or equal to about 0.5 wt %, for example, greater than or equal to about 1 wt %, or greater than or equal to about 2 wt % with respect to a total amount of the composition. The amount of the photopolymerizable monomer may be less than or equal to about 70 wt %, for example, less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, or less than or equal to about 10 wt % with respect to a total weight of the composition.

In some embodiments, the composition may further include a multi-thiol compound having at least two thiol groups at its terminal ends. The multi-thiol compound may include a compound represented by Chemical Formula 6:

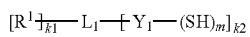

Chemical Formula 6 wherein $R^1$ includes hydrogen, a substituted or unsubstituted C1 to C40 (or C1 to C30) linear or branched alkyl group, a C2 to C40 (or C2 to C30) linear or branched alkenyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C2 to C30 heterocycloalkyl group, a C1 to C10 alkoxy group, a hydroxy group, —$NH_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously); an isocyanate group; a halogen; —ROR' (wherein R is a substituted or unsubstituted C1 to C20 alkylene group and R' is hydrogen or a C1 to C20 linear or branched alkyl group); an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are the same or different, and are independently hydrogen or a C1 to C20 linear or branched alkyl group), —C(=O)ONRR' (wherein R and R' are the same or different, and are independently hydrogen or a C1 to C20 linear or branched alkyl group), or a combination thereof, $L_1$ includes a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C2 to C30 heterocycloalkylene group, wherein at least one methylene (—$CH_2$—) of the substituted or unsubstituted C1 to C30 alkylene group or the substituted or unsubstituted C2 to C30 alkenylene group may be replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, $Y_1$ includes a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The multi-thiol compound may include a compound of Chemical Formula 6-1:

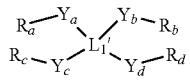

Chemical Formula 6-1 wherein $L_1'$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—$CH_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is independently $R^1$ of Chemical Formula 6 or SH, provided that at least two of them are SH.

The multi-thiol compound may react with a photopolymerizable monomer without an adverse effect on the dispersion of quantum dots, and thereby prevent the heat treatment (e.g., post-baking), which is accompanied by the photoresist process, from deteriorating the luminous efficiency of the quantum dots dispersed in the pattern. Without wishing to be bound by any theory, it is believed that the multi-thiol compound may allow the polymer to form a denser network by further reacting with the photopolymerizable monomer described later. In addition, the multi-thiol compound may provide a bond between the quantum dots and the photopolymerizable monomers to ensure the dispersion and the stability of the quantum dots in the composite. A pattern formed from the photosensitive resin composition including the multi-thiol compound may enhance the light emitting properties (such as a property of maintaining the blue-light conversion rate), for example, by at least about 2 times in comparison with the composite without the reactive compound. In some embodiments, the photosensitive composition may maintain a blue light conversion rate of greater than or equal to about 40% (e.g., greater than or equal to about 45% or greater than or equal to about 60%) of the initial value when it is developed by an alkali aqueous solution and then dried and heated at 180° C. for 30 min.

The multi-thiol compound may include a dithiol compound, a trithiol compound, a tetrathiol compound, or a combination thereof. For example, the multi-thiol compound may include glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

In the photosensitive composition, the amount of the multi-thiol compound may be greater than or equal to about 0.1 wt %, for example, greater than or equal to about 0.5 wt %, greater than or equal to about 1 wt %, greater than or equal to about 2 wt %, greater than or equal to about 3 wt %, or greater than or equal to about 4 wt % based on the total weight of the composition.

In the photosensitive composition, the amount of the multi-thiol compound may be less than or equal to about 50 wt %, for example, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, less than or equal to about 30 wt %, less than or equal to about 29 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, less than or equal to about based on the total weight of the composition.

In the photosensitive composition, the amount of the multi-thiol compound may be greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on the solid content of the composition. Based on the solid content of the composition, the amount of the multi-thiol compound may be less than or equal to about 55 wt %, for example, less than or equal to about 50 wt %, less than or equal to about 40 wt %, less than or equal to about 35 wt %, less than or equal to about 30 wt %, or less than or equal to about 27 wt %.

The photosensitive composition includes a photoinitiator. Types of the photoinitiator are not particularly limited and may be selected appropriately. For example, the photopolymerization initiator that can be used may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, the examples of the triazine compound may include to 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)-6-(piperonyl)-s-triazine, and 2,4-bis(trichloromethyl)-6-(4'-methoxy styryl)-s-triazine, but are not limited thereto.

Examples of the acetophenone compound may be 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-di methylamino-1-(4-morpholinophenyl)-butan-1-one, and the like, but are not limited thereto.

Examples of the benzophenone compound may be benzophenone, benzoyl benzoate, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, and the like, but are not limited thereto.

Other than the foregoing photoinitiators, a carbazole compound, a diketone compound, a sulfonium borate compound, a diazo compound, a biimidazole compound may be used as a photoinitiator.

In the photosensitive composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In some embodiments, an amount of the photoinitiator may be greater than or equal to about 0.05 wt %, for example, greater than or equal to about 0.1 wt %, or greater than or equal to about 1 wt %, and less than or equal to about 15 wt %, for example, less than or equal to about 12 wt %, based on the solid content of the composition.

The photosensitive composition of the embodiments may further include a metal oxide fine particle, in particular a plurality of metal oxide fine particles. An average particle size of the metal oxide fine particle may be greater than or equal to about 30 nm, for example, greater than or equal to about 100 nm, greater than or equal to about 150 nm, greater than or equal to about 160 nm, greater than or equal to about 170 nm, greater than or equal to about 180 nm, or greater than or equal to about 190 nm. An average particle size of the metal oxide fine particle may be less than or equal to about 1,000 nm, less than or equal to about 900 nm, less than or equal to about 800 nm, less than or equal to about 700 nm, less than or equal to about 600 nm, or less than or equal to about 500 nm. An average size of the metal oxide fine particle may be from about 100 nm to about 500 nm or from about 190 nm to about 450 nm. The size of the fine particle may be selected considering the amounts of other components, a desired thickness of the composite, and the like.

The metal oxide fine particle may include a titanium oxide, a silicon oxide, a barium oxide, a zinc oxide, or a combination thereof. The metal oxide fine particle may include $TiO_2$, $SiO_2$, $BaTiO_3$, $Ba_2TiO_4$, ZnO, or a combination thereof. An amount of the metal oxide fine particle may be greater than or equal to about 0.01 wt %, for example, greater than or equal to about 0.05 wt %, greater than or equal to about 0.1 wt %, greater than or equal to about 0.5 wt %, greater than or equal to about 1 wt %, or greater than or equal to about 1.5 wt %, based on a total amount of the composition. An amount of the metal oxide fine particle may be less than or equal to about 50 wt %, for example, less than or equal to about 45 wt %, less than or equal to about 30 wt %, less than or equal to about 25 wt %, or less than or equal to about 20 wt %.

Based on a total solid content (TSC), an amount of the metal oxide fine particle may be greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %. Based on a total solid content (TSC), an amount of the metal oxide fine particle may be less than or equal to about 60 wt %, less than or equal to about 50 wt %, less than or equal to about 40 wt %, or less than or equal to about 35 wt %.

In the foregoing ranges of the particle size and the amount, the metal oxide fine particle may enhance luminous properties of a quantum dot polymer composite (or a pattern thereof) prepared from the photosensitive composition.

If desired, the photosensitive composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite.

The light diffusing agent may increase a refractive index of the composition in order to increase a chance of the incident light to meet with quantum dots. The light diffusing agent may include inorganic oxide particles such as alumina, silica, zirconia, titanium oxide, or zinc oxide particulates, and metal particles such as gold, silver, copper, or platinum, but is not limited thereto.

The leveling agent may prevent stains or spots and to improve planarization and leveling characteristics of a film, and examples thereof may include the following but are not limited thereto. For example, a fluorine-containing leveling agent may include commercial products, for example BM-1000® and BM-1100® of BM Chemie Inc.; MEGA-FACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SUR-FLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adhesion with respect to the substrate, and examples thereof may include a silane coupling agent. Examples of the silane coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, and the like. Types and the amounts of the additives may be adjusted, if desired.

If present, the amount of the additives may be greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The photosensitive composition may further include an organic solvent. Types of the solvent available for the composition of the embodiments are not particularly limited. The solvent may be included in the quantum dot binder dispersion. Types and the amount of the solvent may be determined depending on the types and the amounts of the foregoing main components (i.e., the quantum dots, the COOH group-containing binder, the photopolymerizable monomer combination, the photoinitiator, and if present, the multi-thiol compound,) and other additives. The composition may include the solvent in such an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives), its affinity for the alkali developing solution, and its boiling point.

Examples of the solvent may be: ethyl 3-ethoxy propionate; an ethylene glycol such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, and diethylene glycol dimethyl ether; glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate and dipropylene glycol monoethyl ether acetate; amides such as N-methylpyrrolidone, dimethyl formamide, and dimethyl acetamide; ketones such as methyl ethyl ketone (MEK), methyl isobutyl ketone (MIBK), and cyclohexanone; petroleum products such as toluene, xylene, and solvent naphtha; esters such as ethyl acetate, propyl acetate, butyl acetate, cyclohexyl acetate, and ethyl lactate; ethers such as diethyl ether, dipropyl ether, and dibutyl ether; and combinations thereof.

The photosensitive composition of the embodiments may be prepared by a method that includes:

preparing a binder solution including the carboxylic acid group containing binder and a solvent;

preparing a quantum dot binder dispersion including the plurality of the quantum dots with the binder solution; and combining the quantum dot binder dispersion with other components (e.g., a photoinitiator, the photopolymerizable monomer, the multi-thiol compound, and optionally, at least one of the foregoing additives.

The luminescent material may be included in the quantum dot binder dispersion and/or the binder solution or may be added at the step of mixing with other components, and it is not limited thereto.

A combining manner is not particularly limited, and may be appropriately selected. For example, each component may be combined sequentially or simultaneously.

The method may further include selecting quantum dots including an organic ligand bonded to the surface, and selecting a binder capable of dispersing the quantum dots (e.g., a carboxylic acid group-containing binder). In the step of selecting the binder, a chemical structure and an acid value of the copolymer may be considered.

The photosensitive composition may be developable with an alkaline aqueous solution, and thus a quantum dot-polymer composite pattern may be patterned from the photosensitive composition without using an organic solvent developing solution. A non-limiting method of forming a pattern is explained referring to FIG. 1.

First, the photosensitive composition is coated on a predetermined substrate (e.g., a glass substrate or a glass substrate coated with a predetermined thickness of $SiN_x$ (protective layer) (e.g., 500 to 1,500 Angstroms (Å) of the protective layer)) in an appropriate manner such as spin coating, slit coating, and the like to form a film of a predetermined thickness (e.g., a thickness of greater than or equal to about 3 μm and less than or equal to about 30 μm). The formed film may be pre-baked, at a temperature near or below the boiling point of the solvent as used) if desired. The specific conditions (such as a temperature, a duration, and an atmosphere) for prebaking may be appropriately selected.

The formed (or optionally, pre-baked) film is exposed to light of a predetermined wavelength under a mask having a predetermined pattern. The wavelength and the intensity of light may be selected depending on the types and the amounts of the photoinitiator, the types and the amounts of quantum dots, or the like.

The exposed selected area of the film is treated (e.g., sprayed or immersed) with an alkali developing solution, and thereby the unexposed region in the film is dissolved to provide a desired pattern. The obtained pattern may be post-baked, if desired, to improve crack resistance and solvent resistance of the pattern, for example, at a temperature of about 150° C. to about 230° C. for a predetermined time (e.g., greater than or equal to about 10 min or greater than or equal to about 20 min). Even after the performing of the post-bake process, the pattern obtained from the photosensitive composition may show improved thermal stability, so that a maintenance percentage may be 30% or higher (e.g., 40% or higher, 50% or higher, 60% or higher, or 70% or higher). As used herein, the term "maintenance percentage or maintenance ratio" is a percentage of the light conversion rate of a quantum dot polymer composite or a pattern thereof after a heat treatment at a temperature of about 180° C. for 30 minutes with respect to its the light conversion rate after being prebaked.

When a quantum dot-polymer composite obtained from the photosensitive composition is used as a color filter, two or three types of photosensitive compositions each including red light emitting quantum dots, green light emitting quantum dots, (or optionally, blue light emitting quantum dots) are prepared, and the patterning process is repeated as many times as necessary (e.g., two times or three times) for each composition to provide a quantum dot-polymer composite having a desirable pattern.

In embodiments, a quantum dot-polymer composite includes: a polymer matrix; and a plurality of quantum dots and a luminescent material other than the quantum dot, the plurality of quantum dots and the luminescent material being dispersed in the polymer matrix, wherein the luminescent material includes a fluorophore, a (e.g., nanosized) inorganic phosphor, or a combination thereof. The plurality of quantum dots may be dispersed (e.g., distributed separately) in the matrix (e.g., without agglomeration). The polymer matrix may include a carboxylic acid group (—COOH)-containing binder; a polymerization product of a photopolymerizable monomer having a carbon-carbon double bond; or a combination thereof. For example, the matrix may include a linear polymer (e.g., the binder) and/or a cross-linked polymer.

Each of the components (e.g., quantum dots, luminescent materials, binders, photopolymerizable monomer, and the like) are the same as set forth above.

In embodiments, the quantum dot polymer composite may include various types of polymer matrix including a thiol-ene polymer, a (meth)acrylate polymer, a urethane polymer, an epoxy polymer, a vinyl polymer, a silicone polymer, or a combination thereof.

Figure 2:
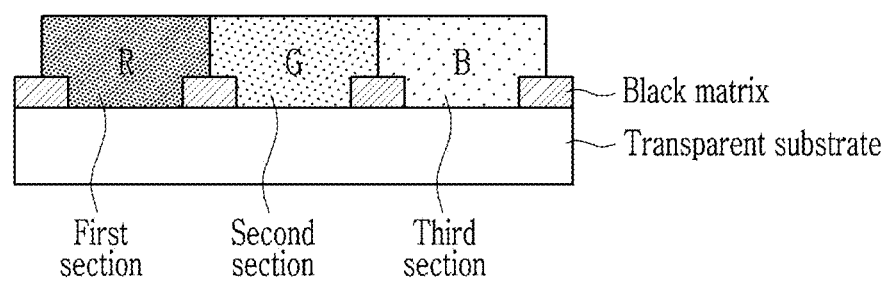
FIG. 2 is a schematic view showing an exemplary embodiment of a cross-section of a layered structure.

In embodiments, a layered structure includes a substrate (e.g., a transparent substrate); and a luminescent layer (e.g., photoluminescent layer) disposed on the substrate and including a pattern of the aforementioned quantum dot polymer composite, the pattern of the quantum dot polymer composite includes a repeating section including a first section configured to emit light of a first light (e.g., a green light or a red light). (see FIG. 2)

The (transparent) substrate may be a substrate including an insulating material. The insulating material may include glass; various polymers (e.g., polyester such as polyethylene terephthalate (PET) or polyethylene naphthalate (PEN)), polycarbonate, polyimide, polyamide-imide, poly(meth)acrylate, a thiol-ene polymer, and poly(meth)acrylic acid; polysiloxane (e.g., PDMS); an inorganic material such as $Al_2O_3$ or ZnO; or a combination thereof, but is not limited thereto. As used herein, the term "transparent" refers to the case where light transmittance is greater than or equal to about 80%, for example, greater than or equal to about 85%, greater than or equal to about 88%, greater than or equal to about 90%, greater than or equal to about 95%, greater than or equal to about 97%, or greater than or equal to about 99% for a predetermined light (e.g., that be emitted from the quantum dots included in the photoluminescent layer). A thickness of the substrate may be appropriately selected considering a substrate material but is not particularly limited. The substrate may have flexibility. The substrate may be an upper substrate of the liquid crystal panel.

The repeating section may further include a second section configured to emit a second light (e.g., a red light or a green light) that is different from the first light, a third section configured to emit a third light that is different from the first light and the second light, or a combination thereof. At least one of the second section and the third section may include the quantum dot polymer composite.

A maximum photoluminescent peak wavelength of the first section or the second section may be in a range of greater than about 480 nm and less than or equal to about 580 nm, for example, in a range of greater than about 500 nm and less than or equal to about 540 nm. A maximum photoluminescent peak wavelength of the second section or the first section may be in a range of greater than about 580 nm and less than or equal to about 680 nm, for example, in a range of greater than about 610 nm and less than or equal to about 640 nm. A maximum photoluminescent peak wavelength of the third repeating unit may be in a range of greater than or equal to about 380 and less than or equal to about 480 nm.

Details for the quantum dot polymer composite and its pattern are the same as set forth above.

The quantum dot polymer composite may be included in an electronic device. The electronic devices may include a light emitting diode (LED), an organic light emitting diode (OLED), a sensor, an imaging sensor, a solar cell, or a display device. The display device may be a liquid crystal display device or an OLED device. In some non-limiting embodiments, the aforementioned quantum dot polymer composite may be included in a quantum dot based color filter.

Figure 3:
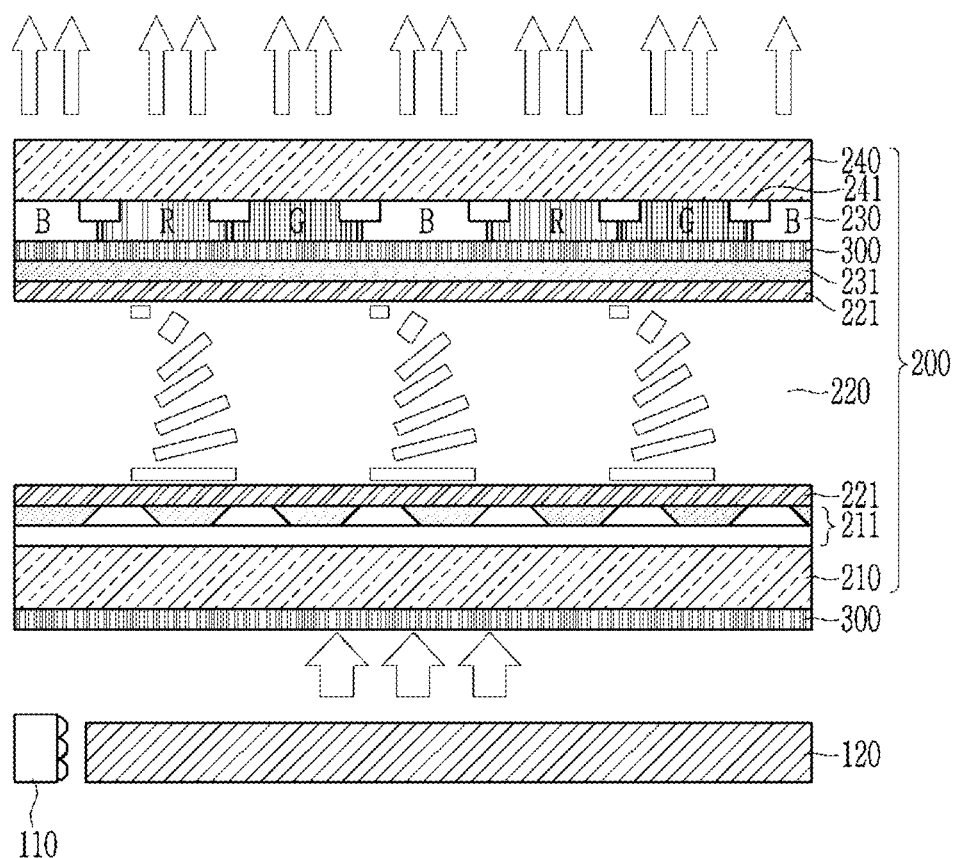
FIG. 3 is a cross-sectional view of an electronic device (a liquid crystal display device) according to an exemplary embodiment.
Figure 4:
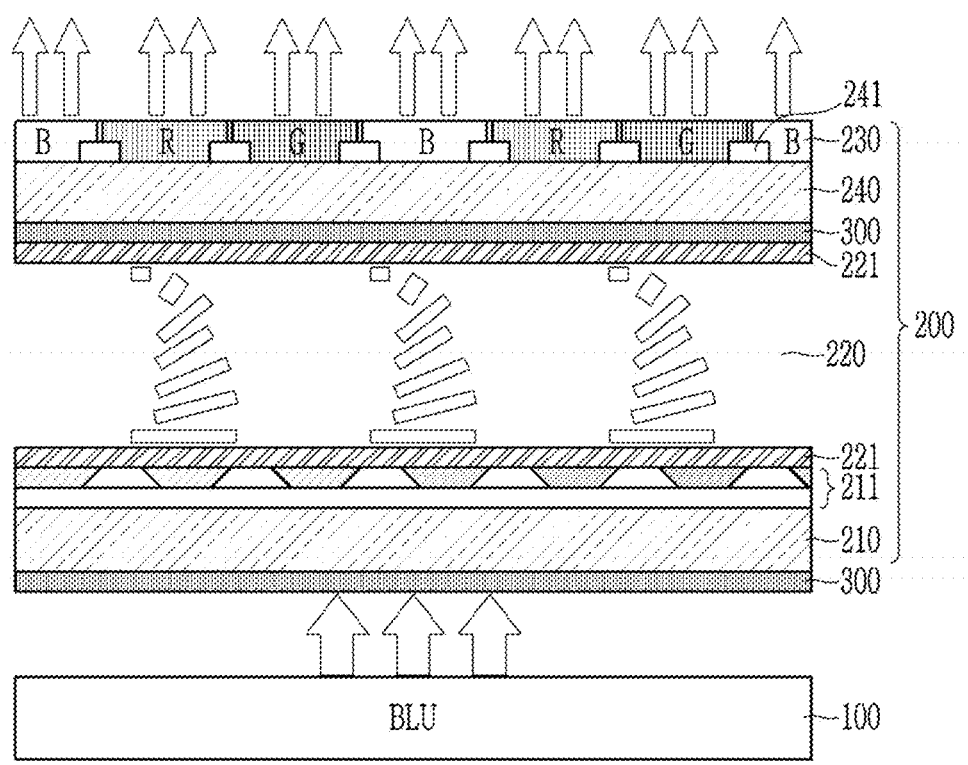
FIG. 4 is a cross-sectional view of an electronic device according to an exemplary embodiment.

In some non-limiting embodiments, referring to FIG. 3 and FIG. 4, the liquid crystal display includes: a liquid crystal panel 200, an optical element 300 (e.g., a polarizing plate) that is disposed in and/or below the liquid crystal panel 200, and a back light unit that is disposed below the lower optical element 300 and includes a blue light emitting source. The liquid crystal panel 200 may include a lower substrate 210, an upper substrate 240, a liquid crystal layer 220 interposed between the upper and the lower substrates. The device include a color filter 230 disposed on a top surface or a bottom surface of the upper substrate 240. The color filter layer 230 includes the aforementioned quantum dot-polymer composite or a pattern thereof.

The back light unit may include a light source 110 and optionally a light guide panel 120.

A wire plate 211 is disposed on an internal surface, e.g., a top surface, of the lower substrate 210. The wire plate 211 may include a plurality of gate wires (not shown) and data wires (not shown), a thin film transistor disposed adjacent to a crossing region of gate wires and data wires, and a pixel electrode for each pixel area, but is not limited thereto. In an embodiment, for example, pixel areas may be defined by the gate and data wires. The wire plate may have any structure or feature known in the art, and are not particularly limited.

The liquid crystal layer 220 may be disposed on the wire plate 211. The liquid crystal layer 220 may include alignment layers 221 on and under the layer 220 to initially align the liquid crystal material included therein. The liquid crystal material and the alignment layer may have any structure or feature known in the art (e.g., liquid crystal material, alignment layer material, method of forming liquid crystal layer, thickness of liquid crystal layer, or the like) and are not particularly limited.

The optical element 300 may be a member for maintaining polarization of light emitted from the photoluminescent color filter layer. In an embodiment, for example, the optical element 300 may be a polarizer. A black matrix 241 having an opening defined therethrough may be disposed on the upper substrate 240, e.g., the bottom surface of the upper substrate 240, to cover a thin film transistor and a gate line, a data line, or the like of the wire plate disposed on the lower substrate 210. A photoluminescent color filter layer 230 including a first color filter (R) for emitting red light, a second color filter (G) for emitting green light, and/or a third color filter (B) for (emitting or transmitting) blue light may be disposed on the black matrix 241 and in the opening of the black matrix 241. If desired, the photoluminescent layer may further include at least one fourth section. The fourth section may include a quantum dot emitting different colors (e.g., cyan, magenta, and yellow) from the light emitted from the first to third sections. In an exemplary embodiment, the black matrix 241 may have a lattice shape. A transparent common electrode 231 may be provided with the photoluminescent color filter layer.

The third section (B) configured to emit/transmit blue light may be a transparent color filter that does not change a light emitting spectrum of the light source. In this case, blue light emitted from the backlight unit (BLU) may pass the polarizer and the liquid crystal layer and then enter as a polarized light and go out as it is. If needed, the third section may include quantum dots emitting blue light.

If desired, the display device may further include a blue light blocking layer (blue cut filter). The blue cut filter may be disposed between a surface of the first section (R) and the second section (G) and the transparent substrate 300 or over the transparent substrate (not shown). The blue cut filter may be in the form of a sheet having an opening in a region corresponding to a pixel area displaying blue (e.g., a third section emitting blue light) and formed in a region corresponding to first and second sections. In an embodiment, the blue cut filter may be formed by alternately stacking at least two layers having different refractive indexes so as to transmit light in a wavelength region other than the blue light wavelength region and block the blue light. The blocked blue light may be reflected and recycled. The blue cut filter may block light emitted from a blue light source from being directly emitted outside.

Hereinafter, the embodiments are illustrated in more detail with reference to examples. However, the present disclosure is not limited thereto.

EXAMPLES

Analysis Method
[1] Photoluminescence Analysis
Hitachi F-7000 spectrometer is used to obtain a photoluminescence spectrum with irradiation light of 458 nanometers (nm) (532 nm for red light emitting quantum dot (QD)).
[2] UV-Visible Absorption Analysis
Hitachi U-3310 spectrometer is used to perform a UV spectroscopy analysis and UV-Visible absorption spectrum is obtained.
[3] Light Conversion Efficiency (CE)
Using QE 2100 of Otsuka Co., Ltd., a PL spectrum of the excitation light and a PL spectrum of the sample are obtained. A total amount of the excitation light (B) is obtained from the PL spectrum of the excitation light and a total amount of the converted light (e.g., having a red or green light wavelength) (A) and a total amount of the non-converted excitation light (B') are obtained from the PL spectrum of the sample. The conversion rate is calculated from the following equation:

$A/(B-B') \times 100 = CE\ (\%)$

The value of A/B may represent a quantum efficiency, the value of (B−B')/B may represent an excitation (e.g., blue) light absorption rate. Thus, the conversion efficiency (C.E.) may be represented by a percentage of the quantum efficiency with respect to the excitation light rate.

Reference Example 1: Production of Quantum Dots (1) 0.2 millimoles (mmol) of indium acetate, 0.6 mmol of palmitic acid, and 10 milliliters (mL) of 1-octadecene are placed in a flask, subjected to a vacuum state at 120° C. for one hour, and heated to 280° C. after the atmosphere in the flask is exchanged with $N_2$. Then, a mixed solution of 0.1 mmol of tris(trimethylsilyl)phosphine ($TMS_3P$) and 0.5 mL of trioctylphosphine (TOP) is quickly injected, and the reaction proceeds for a predetermined time (e.g., for 20 minutes). The reaction mixture then is rapidly cooled and acetone is added thereto to produce nanocrystals, which are then separated by centrifugation and dispersed in toluene to obtain the InP core nanocrystals.

0.3 mmol (0.056 grams, g) of zinc acetate, 0.6 mmol (0.189 g) of oleic acid, and 10 mL of trioctylamine are placed in a flask, subjected to a vacuum state at 120° C. for 10 minutes, and then heated to 220° C. after the atmosphere in the flask is exchanged with $N_2$. Then, a toluene dispersion of the InP core nanocrystals prepared as described above (optical density: 0.15) and a predetermined amount of S/TOP (i.e., sulfur dissolved or dispersed in the trioctylphosphine) are added to the flask, and then, the resulting mixture is heated to 280° C., while the reaction proceeds for 30 minutes. After the reaction, the reaction solution is quickly cooled to room temperature to obtain a reaction mixture including InP/ZnS semiconductor nanocrystals.

(2) An excess amount of ethanol is added to the reaction mixture including the resulting semiconductor nanocrystals, which is then centrifuged to remove an extra organic material from the reaction mixture of the semiconductor nanocrystals. After centrifugation, the supernatant is discarded and the precipitate is dried and dispersed in chloroform to obtain a quantum dot solution (hereinafter, QD solution). A UV-vis absorption spectrum the QD solution is measured.

The prepared quantum dot including InP/ZnS semiconductor nanocrystal emit (green) light having a maximum photoluminescent peak wavelength (about 529 nm or 540 nm). The quantum yield of the prepared quantum dot is greater than or equal to about 50% (e.g., 50% to 100%).

Experimental Example 1

Figure 5:
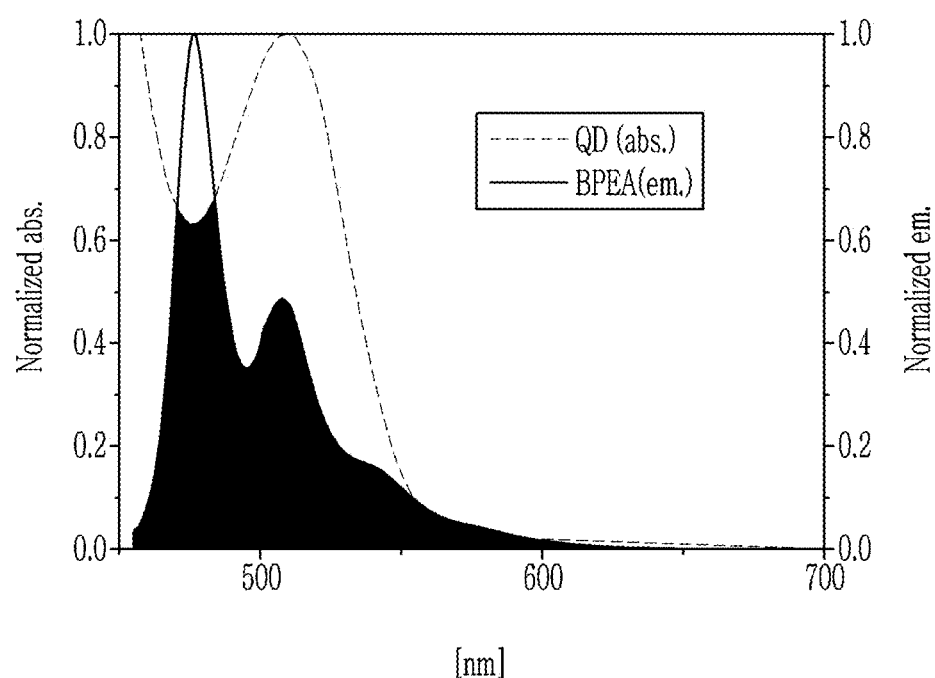
FIG. 5 is a view showing the results of (UV-Vis absorption spectrum and a photoluminescent spectrum of the quantum dot of) Experimental Example 1.

A normalized UV-Vis absorption spectrum of the quantum dot prepared in Reference Example 1 and a normalized photoluminescent spectrum of 9,10-bis(phenyl ethynyl)anthracene (hereinafter, BPEA) are shown in FIG. 5:

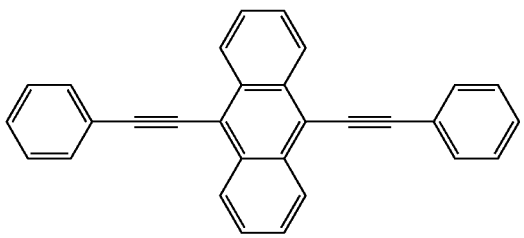 [SMILES: C(#Cc1c2ccccc2c(C#Cc2ccccc2)c2ccccc12)c1ccccc1]

The results of FIG. 5 confirm that the normalized UV-Vis absorption spectrum of the quantum dot prepared in Reference Example 1 and the normalized photoluminescent spectrum of BPEA are overlapped. The percentage of the overlapped area with respect to a total area of the normalized PL spectrum of the BPEA is about 45%.

Experimental Example 2

[1] A predetermined amount of the BPEA in a cyclohexyl acetate solvent is added to a cyclohexyl acetate solution of the quantum dot prepared in Reference Example 1 at a ratio set forth in Table 1 to prepare a dye-quantum dot mixture solution. The optical density of the quantum dot solution and the BPEA solution are measured. Comparing the optical density of the quantum dot solution and the BPEA solution may indicate that the BPEA solution may have an optical density that is 117 times higher than that of the quantum dot solution.

[2] For each of the dye-quantum dot mixture solution, a UV-Visible spectrum analysis is made and the results are compiled in Table 1. The results of Table 1 confirm that an increase in an amount of the dye may result in an increase in the absorption of the mixture solution at 450 nm.

TABLE 1

| Mixing ratio between quantum dot and dye | QD wt [g] | BPEA wt [mg] | Absorption value (Optical Density) at 450 nm |
|---|---|---|---|
| QD only | 0.5 | — | 0.13 |
| QD:BPEA = 10,000:1 | 0.5 | 0.00005 | 0.11 |
| QD:BPEA = 5,000:1 | 0.5 | 0.0001 | 0.12 |
| QD:BPEA = 1,000:1 | 0.5 | 0.0005 | 0.13 |
| QD:BPEA = 750:1 | 0.5 | 0.0067 | 0.13 |
| QD:BPEA = 500:1 | 0.5 | 0.001 | 0.19 |
| QD:BPEA = 250:1 | 0.5 | 0.002 | 0.27 |
| QD:BPEA = 100:1 | 0.5 | 0.005 | 0.43 |
| QD:BPEA = 10:1 | 0.5 | 0.050 | 1.64 |

Examples 1-1 to 1-8

[1] Preparation of Quantum Dot-Binder Dispersion

A chloroform dispersion of green light emitting quantum dots (InP/ZnS core/shell) prepared in Reference Example 1 is prepared. The chloroform dispersion of the QD and 9,10-bis(phenyl ethynyl)anthracene (BPEA) are mixed with a solution of a binder polymer of a four membered copolymer of methacrylic acid, benzyl methacrylate, hydroxyethyl methacrylate, and styrene, (acid value: 130 milligrams (mg) per gram of KOH (mg KOH/g), molecular weight: 8,000 g/mol, acrylic acid:benzyl methacrylate:hydroxyethyl methacrylate:styrene (molar ratio)=61.5%:12%:16.3%:10.2%) (solvent: propylene glycol monomethyl ether acetate, PGMEA, a concentration of 30 percent by weight, wt %) to form a quantum dot-binder dispersion. The weight ratio between the QD and the BPEA in each of Examples 1-1 and 1-8 is shown in Table 2.

[2] Preparation of the Photosensitive Composition

To the quantum dot-binder dispersion prepared in item [1], a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ (as a light diffusing agent), and PGMEA (as a solvent) are added to obtain a composition.

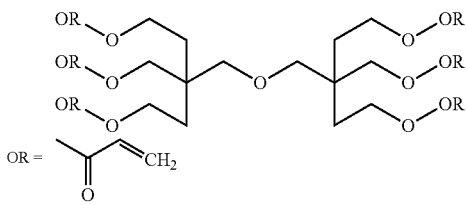

wherein

The prepared compositions includes 10.75 wt % of quantum dots, 6.2 wt % of the binder polymer, 5.3 wt % of the multi-thiol compound, 2.25 wt % of the photopolymerizable monomer, 0.5 wt % of the photoinitiator, and a balance amount of the solvent, based on a total weight of the composition.

The total solid content of the composition (except for the dye/the phosphor) is 25% and the total QD weight content is about 43%.

The composition may form a dispersion without a noticeable phenomenon of aggregation.

[3] Formation of Quantum Dot-Polymer Composite

The composition obtained from item [2] is spin-coated on a glass substrate at 180 revolutions per minute (rpm) for 5 seconds (s) to provide a film. The obtained film is pre-baked at 100° C. for 2 minutes (min) (PRB). The pre-baked film is exposed to light (wavelength: 365 nanometers (nm), intensity: 100 millijoules, mJ) under a mask having a predetermined pattern (e.g., a square dot or stripe pattern) for 1 s (EXP) and developed with a potassium hydroxide aqueous solution (conc.: 0.043%) for 50 seconds to obtain a quantum dot polymer composite. The patterned film prepared is heated at 230° C. for 30 minutes.

For each of the pattern, a photoluminescence analysis is made and a blue absorption rate, a quantum efficiency, and a conversion efficiency are calculated from the results of the photoluminescence analysis. The percentage of the quantum yield with respect to the initial quantum yield is calculated for each of the composition, the prebaked film, the exposed film, and the post baked film, and the results are shown in Table 2.

Comparative Example 1

A quantum dot polymer composite is prepared in the same manner set forth in Example 1-1 except for not using the BPEA. For the prepared pattern, a photoluminescence analysis is made and a blue absorption rate, a quantum efficiency, and a conversion efficiency are calculated from the results of the photoluminescence analysis. The results are shown in Table 2.

Example 2

A quantum dot polymer composite is prepared in the same manner set forth in Example 1-1 except for using a green phosphor of $SrGa_2S_4:Eu^{2+}$ (size: 1~2 um, Maximum PL peak: greater than or equal to 530 nm and less than 550 nm)

instead of the BPEA. For the prepared pattern, a photoluminescence analysis is made and a blue absorption rate, a quantum efficiency, and a conversion efficiency are calculated from the results of the photoluminescence analysis. The results are shown in Table 2.

Example 3-1 and 3-2

A quantum dot polymer composite is prepared in the same manner set forth in Example 1-1 except for using coumarin 6 instead of the BPEA in an amount set forth in Table 2. For the prepared pattern, a photoluminescence analysis is made and a blue absorption rate, a quantum efficiency, and a conversion efficiency are calculated from the results of the photoluminescence analysis. The results are shown in Table 2.

Examples 4-1 and 4-2

A quantum dot polymer composite is prepared in the same manner set forth in Example 1-1 except for using 9,10-Bis[N-(m-tolyl)anilino]anthracene (BTAA) instead of the BPEA in an amount set forth in Table 2. For the prepared pattern, a photoluminescence analysis is made and a blue absorption rate, a quantum efficiency, and a conversion efficiency are calculated from the results of the photoluminescence analysis. The results are shown in Table 2.

Example 5

A quantum dot polymer composite is prepared in the same manner set forth in Example 1-1 except for using 2,5,8,11-tetra-tert-butyl perylene (TBPe) and BTAA instead of the BPEA in an amount set forth in Table 2. For the prepared pattern, a photoluminescence analysis is made and a blue absorption rate, a quantum efficiency, and a conversion efficiency are calculated from the results of the photoluminescence analysis. The results are shown in Table 2.

Example 6

A quantum dot polymer composite is prepared in the same manner set forth in Example 1-1 except for using TBPe instead of the BPEA in an amount set forth in Table 2. For the prepared pattern, a photoluminescence analysis is made and a blue absorption rate, a quantum efficiency, and a conversion efficiency are calculated from the results of the photoluminescence analysis. The results are shown in Table 2.

Comparative Example 3

The same binder solution as in Example 1-1, the same photopolymerizable monomer as in Example 1-1 (a hexaacrylate compound), 1 g of the same photoinitiator as in Example 1-1, 10 g of glycol di-3-mercaptopropionate (hereinafter, 2T), and 300 g of PGMEA are mixed at the same ratio as Example 1-1 to prepare a mixture.

To the obtained mixture, the same chloroform solution of the quantum dots as in Example 1-1 is added at the same ratio as Example 1-1 to prepare a composition.

Figure 6:
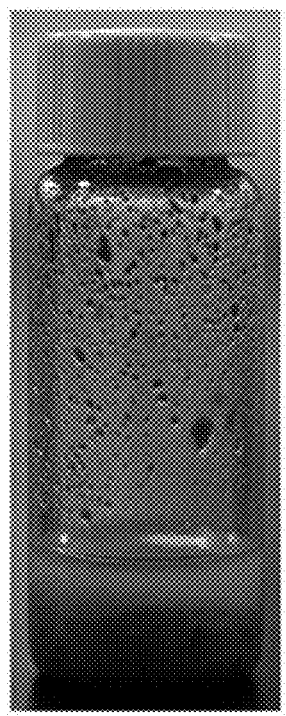
FIG. 6 is a view showing the results of Comparative Example 3.

The photographic image of the obtained photosensitive composition is shown in FIG. 6. The results of FIG. 6 confirm that when the same quantum dot solution as in Example 1-1 is mixed with the same amount and the same type of the binder, the photopolymerizable monomer, the photoinitiator, and the solvent as in Example 1, the agglomeration of the quantum dots is severe, and thus a composition including the quantum dots dispersed therein cannot be obtained.

Comparative Examples 4-1 to 4-4

A photosensitive composition is prepared to form a pattern in accordance with the same procedure as in Example 1, except that no reactive compound is used (Comparative Example 4-1), or as a reactive compound, 10 g of a compound having one thiol group such as octadecyl thiol, methyl 3-mercaptopropionate (1T(H), Comparative Example 4-2), 1-dodecanethiol (1T(D) Comparative Example 4-3), and 3-Methoxybutyl mercaptoacetate (1T(A), Comparative Example 4-4) or 10 g of a compound having two thiol groups (i.e., 2T) is used. The blue light conversion rate for each of the prepared quantum dot polymer composite patterns is measured, and the results are shown in FIG. 7.

Figure 7:
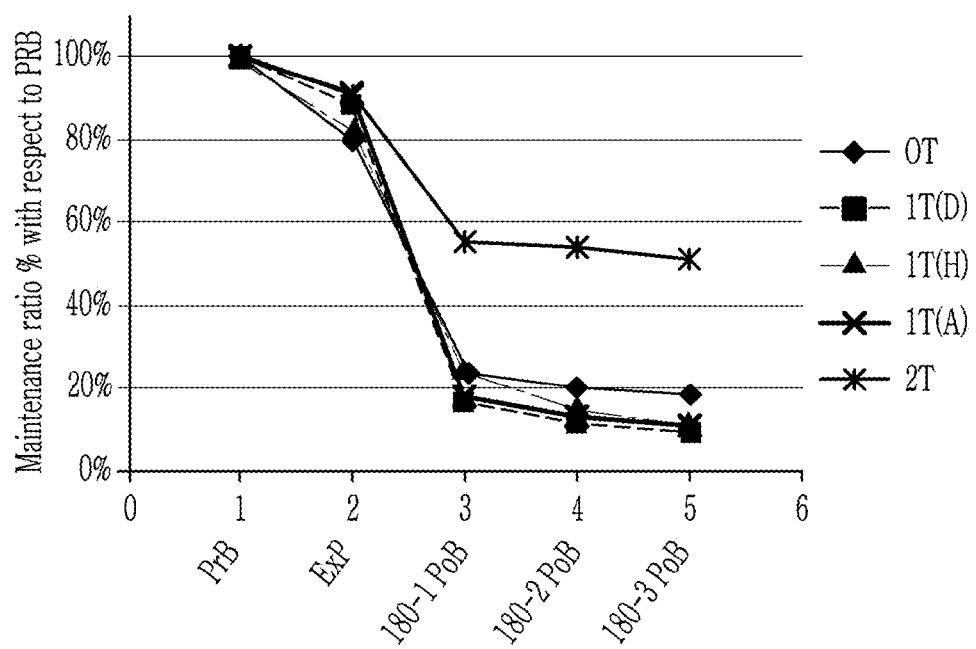
FIG. 7 is a view showing the results of Comparative Example 4.

The results of FIG. 7 confirm that the compound having one thiol group does not have an effect of increasing the process maintenance ratio.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

TABLE 2

| | QD:BPEA weight ratio | Blue absorption rate | Quantum efficiency | Conversion efficiency |
|---|---|---|---|---|
| Comp. Example 1 | Not including BPEA | 79% | 28% | 35% |
| Example 1-1 | QD:BPEA = 10,000:1 | 78% | 27% | 35% |
| Example 1-2 | QD:BPEA = 5,000:1 | 79% | 28% | 35% |
| Example 1-3 | QD:BPEA = 1,000:1 | 82% | 30% | 36% |
| Example 1-4 | QD:BPEA = 750:1 | 77% | 28% | 36% |
| Example 1-5 | QD:BPEA = 500:1 | 84% | 32% | 38% |
| Example 1-6 | QD:BPEA = 250:1 | 89% | 35% | 39% |
| Example 1-7 | QD:BPEA = 100:1 | 93% | 37% | 39% |
| Example 1-8 | QD:BPEA = 10:1 | 95% | 33% | 35% |
| Example 2 | QD:G-phosphor = 250:1 | 84% | 31% | 36% |
| Example 3-1 | QD:Coumarin 6 = 500:1 | 92% | 36% | 40% |
| Example 3-2 | QD:Coumarin 6 = 250:1 | 95% | 38% | 40% |
| Example 4-1 | QD:BTAA = 500:1 | 85% | 31% | 37% |
| Example 4-2 | QD:BTAA = 250:1 | 86% | 32% | 37% |
| Example 5 | QD:TBPe:BTAA = 100:1:1 | 98% | 30% | 31% |
| Example 6 | QD:TBPe = 50:1 | 97% | 18% | 19% |

What is claimed is:

1. A photosensitive composition comprising:
   a quantum dot;
   a luminescent material other than a quantum dot, wherein a weight ratio of the luminescent material with respect to the quantum dot is greater than or equal to about $10^{-4}$:1 and less than or equal to about 0.1:1;
   a carboxylic acid group-containing binder;
   a photopolymerizable monomer comprising a carbon-carbon double bond; and
   a photoinitiator,
   wherein the luminescent material comprises a fluorophore, an inorganic phosphor, or a combination thereof.

2. The photosensitive composition of claim 1, wherein the quantum dot comprises a Group II-VI compound, a Group III-V compound, a Group IV-VI compound, a Group IV element or compound, a Group I-III-VI compound, a Group I-II-IV-VI compound, or a combination thereof.

3. The photosensitive composition of claim 1, wherein a maximum photoluminescent peak wavelength of the quantum dot is present in a range of about 500 nanometers to about 650 nanometers.

4. The photosensitive composition of claim 3, wherein the maximum photoluminescent peak wavelength of the quantum dot is present in a range between about 500 nanometers and about 540 nanometers or between about 610 nanometers and about 640 nanometers.

5. The photosensitive composition of claim 3, wherein a maximum absorption peak wavelength of the luminescent material is present in a range of about 400 nanometers to about 510 nanometers.

6. The photosensitive composition of claim 1, wherein a normalized photoluminescent spectrum of the luminescent material and a normalized ultraviolet-visible absorption spectrum are overlapped and a percentage of an overlapped area with respect to a total area of the normalized photoluminescent spectrum of the luminescent material is greater than or equal to about 10%.

7. The photosensitive composition of claim 6, wherein the percentage of the overlapped area with respect to the total area of the normalized photoluminescent spectrum of the luminescent material is greater than or equal to about 30%.

8. The photosensitive composition of claim 6, wherein the percentage of the overlapped area with respect to the total area of the normalized photoluminescent spectrum of the luminescent material is greater than or equal to about 40%.

9. The photosensitive composition of claim 1, wherein a difference between a first excitonic absorption peak wavelength of the quantum dot and a maximum photoluminescent peak wavelength of the luminescent material is less than or equal to about 160 nanometers.

10. The photosensitive composition of claim 1, wherein a maximum photoluminescent peak wavelength of the quantum dot is present in a range of about 500 nanometers to about 540 nanometers and a difference between a first excitonic absorption peak wavelength of the quantum dot and a maximum photoluminescent peak wavelength of the luminescent material is less than or equal to about 60 nanometers.

11. The photosensitive composition of claim 1, wherein a maximum photoluminescent peak wavelength of the quantum dot is present in a range of about 610 nanometers to about 640 nanometers and a difference between a first excitonic absorption peak wavelength of the quantum dot and a maximum photoluminescent peak wavelength of the luminescent material is from about 110 nanometers to about 160 nanometers.

12. The photosensitive composition of claim 1, wherein the luminescent material comprises an anthracene compound, a naphthalene compound, a triazole compound, a phenoxazine compound, an acridine compound, a perylene compound, a coumarin compound, a porphyrin compound, a pyran compound, a pyrene compound, a fluorene compound, a thiophene compound, a fluorescein compound, a boron-dipyrromethene compound, a green light emitting inorganic phosphor, or a combination thereof.

13. The photosensitive composition of claim 1, wherein the carboxylic acid group-containing binder has an acid value of greater than or equal to about 50 milligrams of KOH per gram and less than or equal to about 200 milligrams of KOH per gram.

14. The photosensitive composition of claim 1, wherein the binder comprises
   a copolymer of a monomer combination comprising
      a first monomer comprising a carboxylic acid group and a carbon-carbon double bond,
      a second monomer comprising a carbon-carbon double bond and a hydrophobic moiety and not comprising a carboxylic acid group, and
      optionally, a third monomer comprising a carbon-carbon double bond and a hydrophilic moiety and not comprising a carboxylic acid group;
   a multiple aromatic ring-containing polymer comprising a carboxylic acid group and comprising a backbone structure in a main chain, wherein the backbone structure comprises a quaternary carbon atom, which is a part of a cyclic group, and two aromatic rings bound to the quaternary carbon atom; or
   a combination thereof.

15. The photosensitive composition of claim 1, wherein the photosensitive composition further comprises a multi-thiol compound having at least two thiol groups at its terminal ends.

16. The photosensitive composition of claim 1, further comprising a metal oxide fine particle, wherein the metal oxide fine particle comprises a titanium oxide, a silicon oxide, a barium oxide, a zinc oxide, or a combination thereof, and
   wherein the metal oxide fine particle has an average particle size of greater than or equal to about 100 nanometers and less than or equal to about 500 nanometers.

17. The photosensitive composition of claim 1, further comprising a solvent, wherein the photosensitive composition comprises a plurality of quantum dots, and wherein, based on a total weight of the composition, the photosensitive composition comprises:
   about 1 weight percent to about 60 weight percent of the plurality of quantum dots;
   about $10^{-4}$ weight percent to about 6 weight percent of the luminescent material;
   about 0.5 weight percent to about 70 weight percent of the carboxylic acid group containing binder;
   about 1 weight percent to about 70 weight percent of the polymerizable monomer;
   about 0.01 weight percent to about 10 weight percent of the photoinitiator; and
   a balance amount of solvent.

18. A quantum dot-polymer composite comprising:
   a polymer matrix;
   a plurality of quantum dots; and
   a luminescent material other than a quantum dot, wherein a weight ratio of the luminescent material with respect to the quantum dot is greater than or equal to about $10^{-4}$:1 and less than or equal to about 0.1:1;
   wherein the quantum dots and the luminescent material are dispersed in the polymer matrix; wherein the luminescent material comprises a fluorophore, an inorganic phosphor, or a combination thereof; and
   wherein the plurality of the quantum dots absorb at least a portion of light emitted from the luminescent material.

19. The quantum dot-polymer composite of claim 18, wherein the polymer matrix comprises a carboxylic acid group-containing binder; a cross-linked polymerization product of a photopolymerizable monomer comprising a carbon-carbon double bond; or a combination thereof.

20. The quantum dot-polymer composite of claim 18, wherein the polymer matrix further comprises a cross-linked polymerization product of a multi-thiol compound having at least two thiol groups at its terminal ends and a photopolymerizable monomer comprising a carbon-carbon double bond.

21. The quantum dot-polymer composite of claim 18, wherein, based on a total weight of the quantum dot-polymer composite,
- an amount of the quantum dots is greater than or equal to about 1 weight percent and less than or equal to about 70 weight percent, and
- an amount of the luminescent material is greater than or equal to about $2 \times 10^{-4}$ weight percent and less than or equal to about 7 weight percent.

22. A layered structure comprising:
- a substrate; and
- a luminescent layer disposed on the substrate and comprising a pattern of the quantum dot polymer composite of claim 18,
- wherein the pattern of the quantum dot polymer composite comprises a repeating section comprising a first section configured to emit a first light.

23. A layered structure of claim 22, wherein the repeating section comprises a second section configured to emit a second light different from the first light, a third section configured to emit or pass a third light different from the first light and the second light, or a combination thereof.

* * * * *